US008867294B2

(12) United States Patent
Kajigaya

(10) Patent No.: US 8,867,294 B2
(45) Date of Patent: Oct. 21, 2014

(54) SEMICONDUCTOR DEVICE, REFRESH CONTROL METHOD THEREOF AND COMPUTER SYSTEM

(71) Applicant: Kazuhiko Kajigaya, Tokyo (JP)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/161,240

(22) Filed: Jan. 22, 2014

(65) Prior Publication Data

US 2014/0133255 A1 May 15, 2014

Related U.S. Application Data

(63) Continuation of application No. 13/044,111, filed on Mar. 9, 2011, now abandoned.

(30) Foreign Application Priority Data

Mar. 12, 2010 (JP) .................................. 2010-056783

(51) Int. Cl.
*G11C 11/406* (2006.01)

(52) U.S. Cl.
USPC .......................................... 365/222; 365/200

(58) Field of Classification Search
CPC ..... G11C 11/406; G11C 11/407; G11C 29/783
USPC .......... 365/149, 189.15, 189.16, 222, 230.08, 365/200; 711/106
See application file for complete search history.

(56) References Cited

U.S. PATENT DOCUMENTS

| 5,590,080 | A | 12/1996 | Hasagawa et al. |
| 5,774,409 | A | 6/1998 | Yamazaki et al. |
| 5,909,407 | A | 6/1999 | Yamamoto et al. |
| 5,940,342 | A | 8/1999 | Yamazaki et al. |
| 5,991,218 | A * | 11/1999 | Kushiyama ............... 365/222 |
| 6,233,195 | B1 | 5/2001 | Yamazaki et al. |
| 6,310,803 | B1 * | 10/2001 | Hidaka .................... 365/200 |
| 6,633,500 | B1 | 10/2003 | Chou et al. |
| 6,944,074 | B2 * | 9/2005 | Chung et al. .............. 365/200 |
| 6,956,777 | B2 * | 10/2005 | Komura et al. ............. 365/200 |
| 2003/0043672 | A1 * | 3/2003 | Inoue et al. ............... 365/222 |
| 2003/0107939 | A1 * | 6/2003 | Yoon et al. ................ 365/222 |
| 2004/0130958 | A1 | 7/2004 | Takahashi et al. |
| 2004/0199717 | A1 | 10/2004 | Kanda et al. |

(Continued)

FOREIGN PATENT DOCUMENTS

| JP | 9-288614 A | 11/1997 |
| JP | 10-3783 A | 1/1998 |
| JP | 2006-236105 A | 9/2006 |

*Primary Examiner* — Douglas King
(74) *Attorney, Agent, or Firm* — Sughrue Mion, PLLC

(57) ABSTRACT

A semiconductor device comprises a first memory cell array, a register storing information of whether or not one of the word lines in an active state exists in a unit area and storing address information, and a control circuit controlling a refresh operation for a refresh word line based on the information in the register when receiving a refresh request. When the one of the word lines in an active state does not exist, memory cells connected to the refresh word line are refreshed. When the one of the word lines in an active state exists, the one of the word lines in an active state is set into an inactive state temporarily and the memory cells connected to the refresh word line are refreshed after precharging bit lines of the memory cells.

21 Claims, 25 Drawing Sheets

(56) References Cited

U.S. PATENT DOCUMENTS

| | | |
|---|---|---|
| 2006/0087903 A1 | 4/2006 | Riho et al. |
| 2006/0195665 A1 | 8/2006 | Aoki |
| 2011/0292710 A1* | 12/2011 | Matsubayashi et al. ........ 365/94 |

* cited by examiner

SEMICONDUCTOR DEVICE, REFRESH CONTROL METHOD THEREOF AND COMPUTER SYSTEM

This is a divisional application of U.S. patent application Ser. No. 13/044,111, filed Mar. 9, 2011, which claims priority from Japanese Patent Application Serial No. 2010-056783, Mar. 12, 2010, all of which are incorporated herein by reference.

BACKGROUND OF THE INVENTION

1. Field of the Invention

The present invention relates to a semiconductor device performing a refresh operation for a memory cell array including a plurality of memory cells, and particularly relates to a semiconductor device performing an auto-refresh operation in a situation where there is an open page in the memory cell array, and a refresh control method thereof.

2. Description of Related Art

In a semiconductor memory device such as a DRAM, a control for improving access efficiency has been introduced, in which a predetermined word line in a memory cell array is activated, data is sensed and amplified through a bit line (so-called "open page") and this state is maintained. Meanwhile, when using the DRAM, for example, it is required to perform a refresh operation for retaining data of memory cells with a constant period. Conventionally, various control methods have been proposed for performing the refresh operation in the semiconductor memory device employing a control of the above open page (for example, refer to Patent References 1 to 3).

For example, Patent Reference 1 discloses a control method for a semiconductor memory device in which memory blocks driven into active/inactive states independently of one another and each of the memory blocks has a plurality of pages. According to the control method of the Patent Reference 1, a page address designating a page in a selected state is stored in a page memory, and after allowing a designated memory block to be in an inactive state in response to a refresh request signal, the memory block is refreshed. Then, after the refresh operation, a corresponding page in the memory block is controlled to be driven into a selected state, and thus a decrease in page hit rate due to the refresh operation is suppressed.

For example, Patent Reference 2 discloses a control method in which when a refresh operation for the DRAM occurs, a row address immediately preceding the refresh operation is stored and the row address is selected to be given to the DRAM again after completion of the refresh operation in order to select the row address, so that a high-speed page mode access that has been interrupted by the refresh operation is resumed.

[Patent Reference 1] Japanese Patent Application Laid-open No. H9-288614 (U.S. Pat. No. 5,774,409)

[Patent Reference 2] Japanese Patent Application Laid-open No. H10-3783

[Patent Reference 3] Japanese Patent Application Laid-open No. 2006-236105 (U.S. Pub. No. 2006/0195665 A1)

However, the control method disclosed in the Patent Reference 1 is applied to a memory operation in which all blocks (corresponding to banks of the DRAM) are always maintained in a page open state, and a problem arises in that it cannot be applied to a general DRAM. Further, each bank of a current DRAM is configured with a plurality of blocks, and one page in one of the blocks is capable of being opened. Therefore, when all banks of the DRAM that are maintained in an open state are used, the refresh operation for blocks having no open page is performed so that the open page is refreshed after being closed and subsequently the closed page needs to be opened again. Thus, this requires a complicated control using a plurality of commands, thereby causing a problem of an increase in consumption current.

Additionally, the control in the current DRAM is generally performed so that a plurality of blocks or a plurality of banks are simultaneously refreshed, and however a control method in this case is not disclosed in the Patent Reference 1. Further, a redundancy relief control using redundant memory cells (redundancy word lines) is implemented in the current DRAM, and however a control method in this case is not disclosed in the Patent Reference 1. Furthermore, in the control method disclosed in the Patent Reference 1, it is assumed that a memory controller issues a plurality of commands, and however a problem arises in that a new controller for the DRAM needs to be designed in order to maintain compatibility with the current DRAM that performs an auto-refresh operation by issuing one command. In addition, the control method disclosed in the Patent Reference 2 has the same problems, and a control method capable of solving a series of these problems has not been proposed yet.

SUMMARY

The present invention seeks to solve one or more of the above problems, or to improve upon those problems at least in part.

One of aspects of the invention is a semiconductor device comprising: a unit area including a first memory cell array that includes a plurality of memory cells arranged at intersections of a plurality of word lines and a plurality of bit lines; a register storing state information of whether or not at least one of the word line is in an active state and address information of the at least one of the word lines; and a control circuit controlling a refresh operation on a refresh word line in the first memory cell array based on the state and address information stored in the register when the control circuit receives a refresh command, the refresh word line being selected in response to the refresh command, wherein when the state information of the register indicates that the at least one of the word lines is in the active state, in the refresh operation the control circuit sets the at least one of the word lines in the active state into an inactive state temporarily, and while the at least one of the word lines is in the inactive state, the control circuit refreshes the memory cells connected to the refresh word line.

Another aspect of the invention is a refresh control of a semiconductor device having a plurality of memory cells arranged at intersections of a plurality of word lines and a plurality of bit lines. The refresh control method of the invention comprises: determining whether or not at least one of the word lines in the active state exists in a unit area including the memory cell array when receiving a refresh request of a refresh word line selected in the memory cell array; refreshing the memory cells connected to the refresh word line if a determination result indicates that the one of the word lines in the active state does not exist; and refreshing the memory cells connected to the refresh word line after temporarily changing one of the word lines in the active state into an inactive state so as to precharge the plurality of bit lines if the determination result indicates that the one of the word lines in the active state exists.

According to the refresh control method of the semiconductor device of the invention, when receiving the refresh request for the refresh word line (refresh page) selected in the memory cell array, it is determined whether or not the word line in the active state (open page) exists in the unit area including the memory cell array. Then, if the open page does not exist, the refresh operation for the refresh page is performed, and if the open page exists, the open page is temporarily closed so that the refresh operation for the refresh page is performed, and thereafter the closed page is returned to an open state again. Thus, even if the refresh operation for the open page cannot immediately performed since the open page exists when an auto-refresh command is issued, a process of issuing another command by interrupting an auto refresh operation is not required, and thus the refresh operation for the refresh page can be rapidly completed within one refresh cycle.

Further, the present invention can be also applied to a computer system comprising a multi-core processor including a plurality of processor cores, and a control block controlling an access to the memory cell array via a bus, in addition to the above-described semiconductor device.

According to the present invention, when receiving the refresh request of the memory cell array, the refresh operation for the refresh page can be reliably completed within one refresh cycle in a predetermined unit area having one page that can be opened in accordance with a situation whether a page that has already been opened exists or not, thereby suppressing an increase in consumption current. In this case, even when the predetermined unit area corresponds to one or more memory cell arrays or corresponds to one block (a plurality of memory cell arrays), the open page can be reliably determined so as to perform a rapid refresh operation. Further, in a semiconductor device having a multi-block configuration or having a multi-bank configuration, when performing the refresh operation in a situation where a page that has already been opened exists, it is not required to precharge bit lines in all areas, and also it is not required to issue a command for opening the page repeatedly, thereby improving memory access efficiency. As a result, it is possible to improve access efficiency of the DRAM employing open-page policy, and particularly a large effect can be obtained when the present invention is applied to a large capacity DRAM having a multi-core CPU.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the invention will be described in detail below with reference to accompanying drawings. However, it goes without saying that the present invention is not limited to the embodiments and can be widely applied based on the disclosure of the claims. In the following embodiments, the present invention is applied to a DRAM (Dynamic Random Access Memory) as an example of a semiconductor device.

First Embodiment

Figure 1:
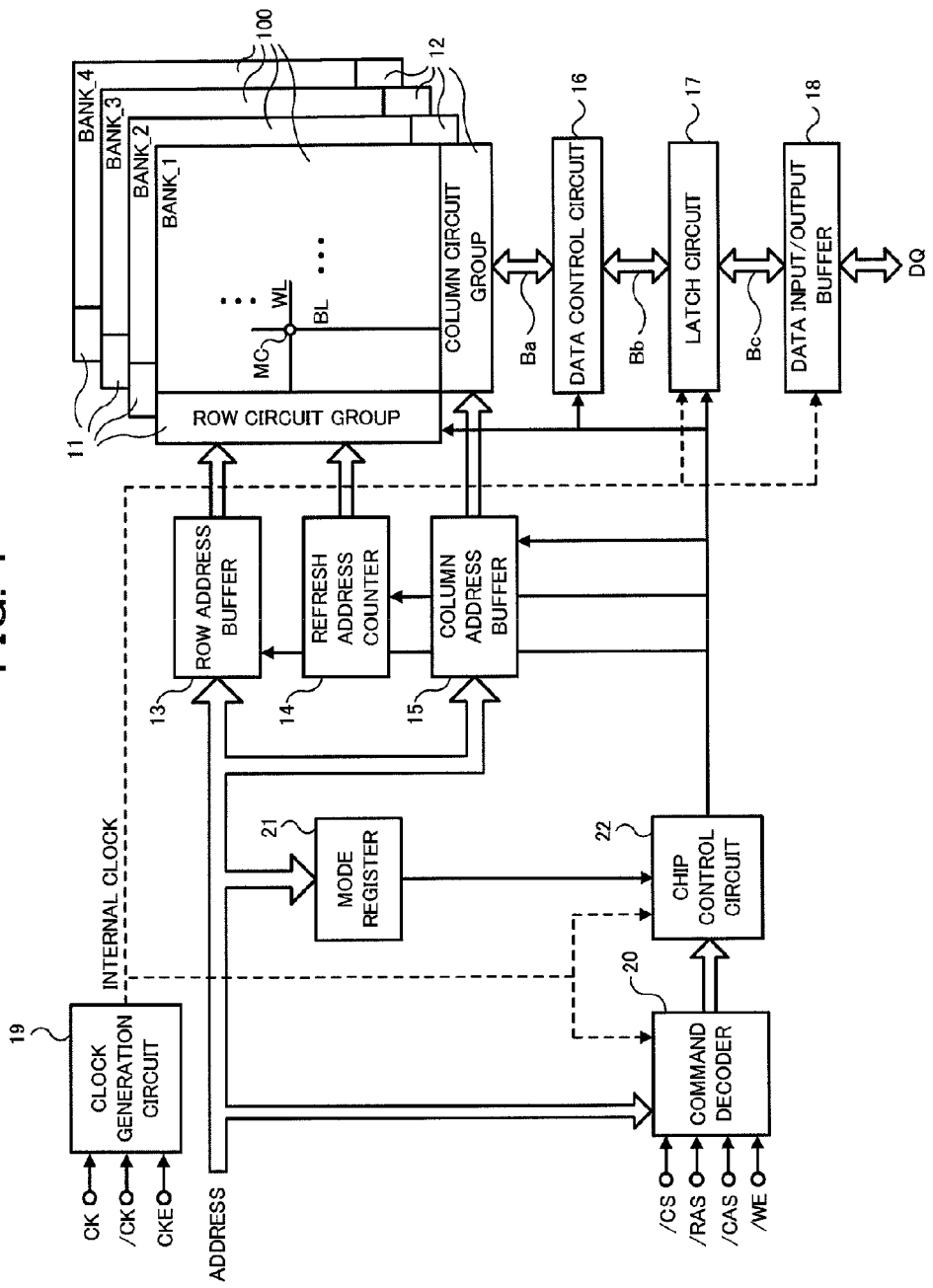
FIG. 1 is a block diagram of an entire configuration of a DRAM of a first embodiment.

FIG. 1 shows a block diagram of an entire configuration of the DRAM of the first embodiment to which the present invention is applied. The DRAM shown in FIG. 1 is implemented on a memory chip C (FIG. 2), and is provided with a memory cell array region 100 divided into a plurality of banks (BANK), a row circuit group 11 and a column circuit group 12 that are attached to each bank. Although there are provided four banks (BANK) in the example of FIG. 1, the number of banks is not restricted. In the memory cell array region 100, a plurality of memory cells MC are formed at intersections of a plurality of word lines WL and a plurality of bit lines BL. The row circuit group 11 includes circuits such as a large number of row decoders (not shown) and the like that are provided corresponding to the plurality of word lines WL. The column circuit group 12 includes circuits such as later-described sense amplifier rows that are provided corresponding to the plurality of bit lines.

A row address included in an externally input address is stored in a row address buffer 13. A refresh address counter 14 generates a refresh address in a refresh operation of the DRAM. The row address stored in the row address buffer 13 and the refresh address generated by the refresh address counter 14 are sent to the row circuit group 11. Meanwhile, a column address included in the externally input address is stored in a column address buffer 15 and subsequently is sent to the column circuit group 12. The column circuit group 12 is connected to a data control circuit 16 via a bus Ba, the data control circuit 16 is connected to a latch circuit 17 via a bus Bb for data transfer, and the latch circuit 17 is connected to a data input/output buffer 18 via a bus Bc. The data input/output buffer 18 performs data input/output (DQ) from/to outside.

A clock generation circuit 19 generates internal clocks based on externally input clock signals CK, /CK and a clock enable signal CKE, and sends the internal clocks to various parts of the DRAM. A command decoder 20 determines a command to the DRAM based on externally input signals (/CS, /RAS, /CAS and /WE), and sends the command to a chip control circuit 22. The chip control circuit 22 controls operations of various parts of the DRAM in response to the command from the command decoder 20. Further, a mode register 21 selectively sets an operation mode of the DRAM, and sends setting information to the chip control circuit 22.

Figure 2:
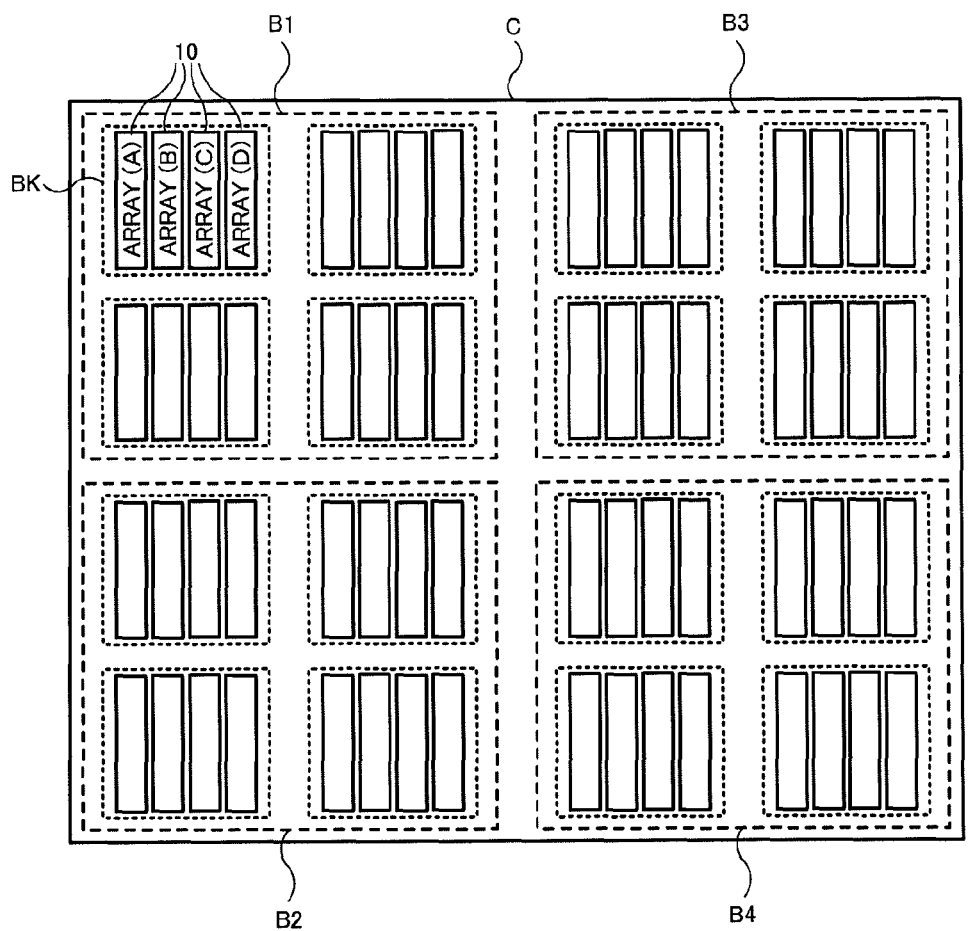
FIG. 2 is a block diagram showing a configuration of a memory cell array region 100 of FIG. 1.

FIG. 2 is a block diagram showing a configuration of the memory cell array region 100 of FIG. 1. In the example of FIG. 2, the entire memory chip C includes four banks B1, B2, B3 and B4. In this case, the DRAM has a four-bank configuration. Further, each of the banks B1 to B4 is composed of four blocks BK. Furthermore, each of the blocks BK is composed of four memory cell arrays 10 (represented as arrays (A), (B), (C) and (D)) aligned in a predetermined direction. In this case, the entire memory chip C includes 64 memory cell arrays 10 in total.

Figure 3:
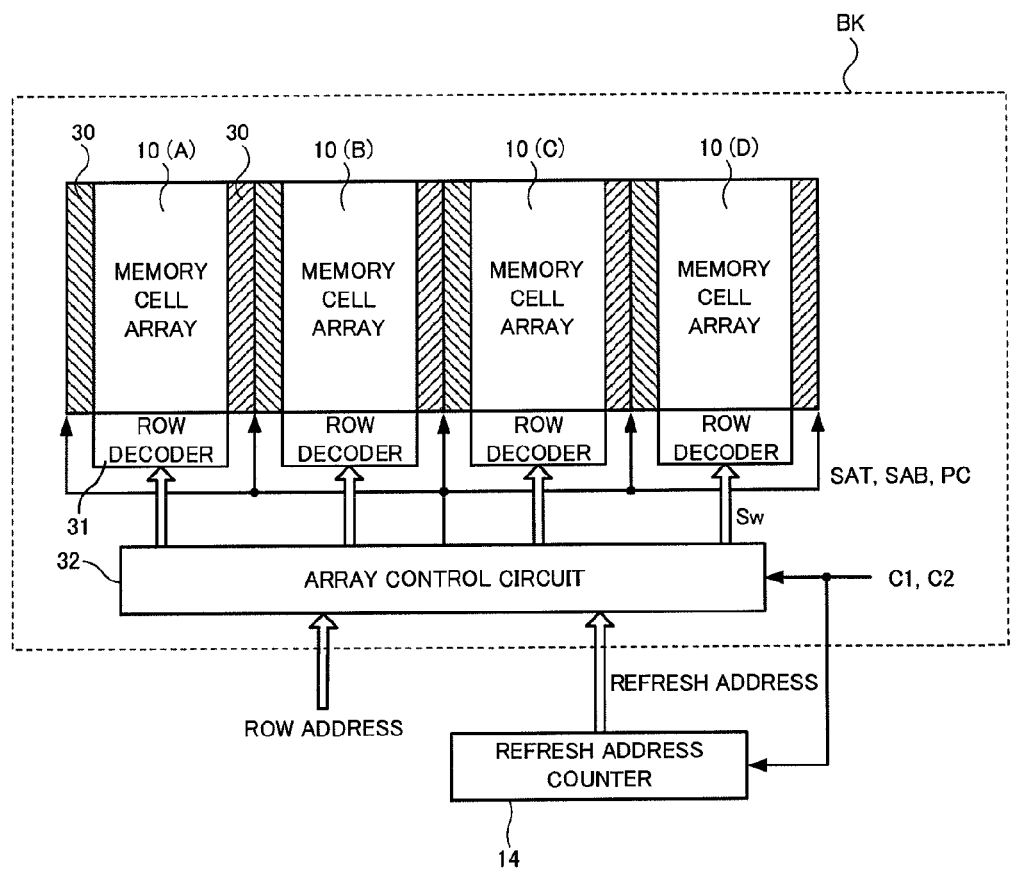
FIG. 3 is a block diagram showing a configuration of one block BK included in one bank B1 of FIG. 2.

FIG. 3 is a block diagram showing a configuration of one block BK (an example of the unit area of the invention) of FIG. 2. In the block BK shown in FIG. 3, four memory cell arrays 10(A), 10(B), 10(C) and 10(D) are arranged in order from left corresponding to the configuration FIG. 2. Sense amplifier rows 30 are arranged on both sides of each memory cell array 10. Each sense amplifier row 30 includes a plurality of sense amplifiers arranged in a zigzag alignment on both sides of the bit lines BL of the memory cell array 10. Further, row decoders 31 each selecting a word line WL corresponding to the row address are arranged at one ends of the memory cell arrays 10. Thus, in the example of FIG. 3, eight sense amplifier rows 30 and four row decoders 31 are arranged in total corresponding to the four memory cell arrays 10. When one word line WL corresponding to the row address changes into a selected state, a signal voltage corresponding to the stored data of the memory cells MC on the word line WL is read out to the bit line BL, and is sensed and amplified by a sense amplifier connected to the bit line BL.

Further, in the block BK of FIG. 3, there is provided an array control circuit 32 controlling respective operations of the memory cell arrays 10, the sense amplifier rows 30 and the row decoders 31. The array control circuit 32 receives the row address from the outside and the refresh address generated by the refresh address counter 14, and also receives various commands corresponding to determination result of the command decoder 20. There are provided commands including, for example, a normal operation command C1 corresponding to a bank active command issued in a normal operation, and an auto-refresh command C2 issued with a refresh request. Further, the array control circuit 32 supplies a word line select signal Sw to each row decoder 31, and supplies various control signals (SAT, SAB and PC) to each sense amplifier row 30.

The array control circuit 32 selectively activates one word line WL designated by the row address in response to the word line select signal Sw when receiving the normal operation command (bank active command) C1, and controls the sensing and amplifying operation of a corresponding sense amplifier in response to sense amplifier control signals SAT and SAB. The operating state at this point is referred to as "page open state".

Meanwhile, the array control circuit 32 selectively activates one word line WL designated by the refresh address in response to the word line select signal Sw when receiving the auto-refresh command C2, and controls the sensing and amplifying operation of a corresponding sense amplifier in response to the sense amplifier control signals SAT and SAB. Thereby, memory cells MC connected to the word line WL in the active state are refreshed. Thereafter, the word line WL is changed into a non-selected state so as to change the block BK into a precharged state, and the auto refresh operation completes.

Figure 4:
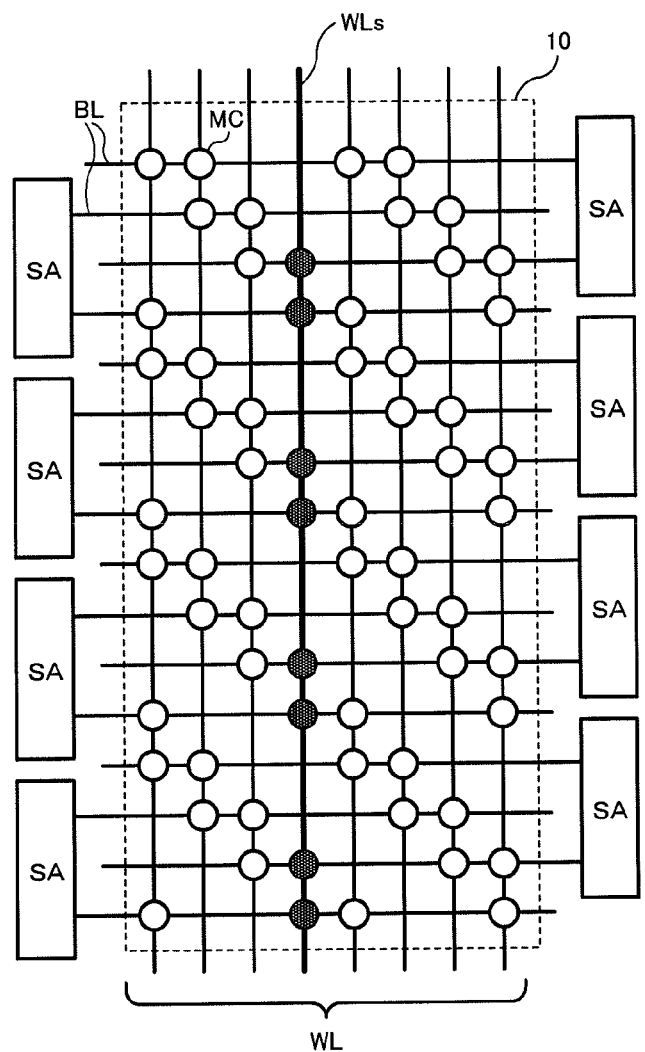
FIG. 4 is a specific configuration example of a memory cell array 10 of the DRAM of the first embodiment.

FIG. 4 shows a specific configuration example of the memory cell array 10. In FIG. 4, two bit lines BL form a complementary pair, and a memory cell MC is arranged at one of two intersections of the complementary bit line pair and each word line WL. Further, each sense amplifier SA in the sense amplifier rows 30 on both sides is connected to two bit lines BL as the complementary bit line pair. In FIG. 4, one selected word line WLs (the one of the word lines in the active state of the invention) as a page in an open state is shown. Since eight memory cells MC are arranged on the selected word line WLs, when the selected word line WLs is activated, stored data of the eight memory cells MC is read out through the bit lines BL and amplified by eight sense amplifiers SA. In addition, FIG. 4 shows a partial configuration example, and actually the memory cell array 10 includes more word lines WL (for example, 512 word lines WL) and more complementary bit line pairs (for example, 512 pairs). In the following description, partial areas of the entire memory cell array 10 will be shown for the simplicity, similarly as in FIG. 4.

Figure 5:
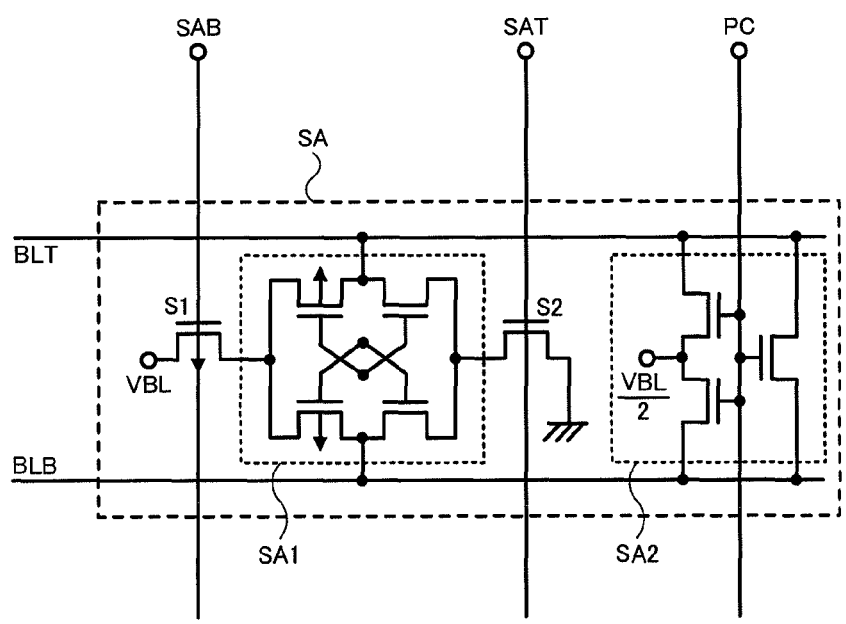
FIG. 5 is a diagram showing a circuit configuration example of a sense amplifier SA of FIG. 4.

FIG. 5 shows a circuit configuration example of the sense amplifier SA of FIG. 4. Two bit lines BLT and BLB forming the complementary bit line pair are connected to the sense amplifier SA shown in FIG. 5. The sense amplifier SA includes a determination latch circuit SA1, an equalizing circuit SA2, a switch S1 composed of a PMOS transistor, and a switch S2 composed of an NMOS transistor.

The determination latch circuit SA1 is a latch circuit in which an inverter circuit receiving one bit line BLT and an inverter circuit receiving the other bit line BLB are cross-coupled to each other at their inputs and outputs. The determination latch circuit SA1 is supplied with a supply voltage VBL via the switch S1 controlled in response to the sense amplifier control signal SAB, and is supplied with a ground potential via the switch S2 controlled in response to the sense amplifier control signal SAT. The equalizing circuit SA2 includes two (one pair of) NMOS transistors precharging the bit line pair BLT and BLB to a voltage VBL/2 in response to a precharge control signal PC and one NMOS transistor equalizing the bit line pair BLT and BLB in response to the precharge control signal PC.

In FIG. 5, the precharge control signal PC is changed to "high" in a precharge operation, and the bit line pair BLT and BLB is precharged to VBL/2 as a half voltage of the supply voltage VBL that is a bit line amplitude. Then, the precharge control signal PC is changed to "low", and when the word line WL is activated, a signal voltage is read out to one of the bit line pair BLT and BLB. Thereafter, the sense amplifier control signal SAT is changed to "high", the sense amplifier control signal SAB is changed to "low", and the read signal voltage is sensed and amplified to the supply voltage VBL and the ground potential by the determination latch circuit SA1.

Figure 6:
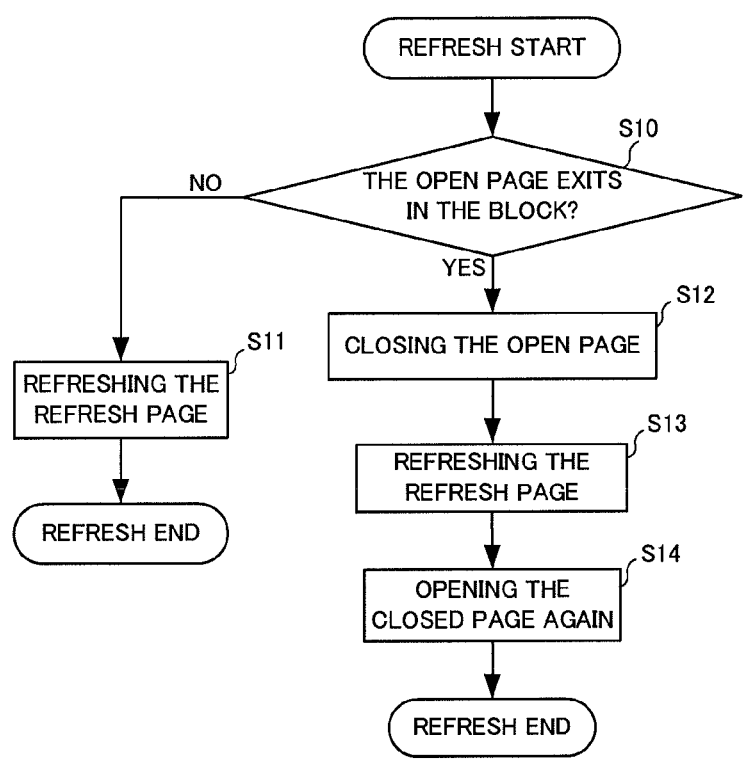
FIG. 6 is a flowchart showing a flow of a refresh control performed in the DRAM of the first embodiment.

Next, a refresh control in the DRAM of the first embodiment will be described using FIGS. 6 to 10. FIG. 6 is a flow chart showing a flow of the refresh control performed in the DRAM of the first embodiment. When the array control circuit 32 of FIG. 3 receives the auto-refresh command C2, the control of FIG. 6 is started, and it is determined whether or not a page in an open state (hereinafter, referred to as "open page") exists in the block BK (Step S10). If the open page does not exist in the block BK (Step S10: NO), a word line WL designated by the refresh address (the refresh word line of the invention) is selected so that a refresh operation of memory cells MC in a corresponding page (hereinafter, referred to as "refresh page") is performed (Step S11), and the refresh control of FIG. 6 completes.

On the other hands, if the open page exists in the block BK (Step S10: YES), the open page is closed by precharging the bit line pair BLT and BLB after changing the word line WL corresponding to the open page into an inactive state (Step S12). Subsequently, the word line WL designated by the refresh address is selected as a refresh page, and the target memory cells MC are refreshed (Step S13). Thereby, a required auto-refresh completes. Thereafter, the page closed at Step S12 is changed into the page open state again by selecting the word line WL corresponding to the page (Step S14), and a signal voltage read out from the target memory cells MC to the bit line pair BLT and BLB is sensed and amplified by the sense amplifier SA. Thereby, the refresh control of FIG. 6 completes.

Figure 7:
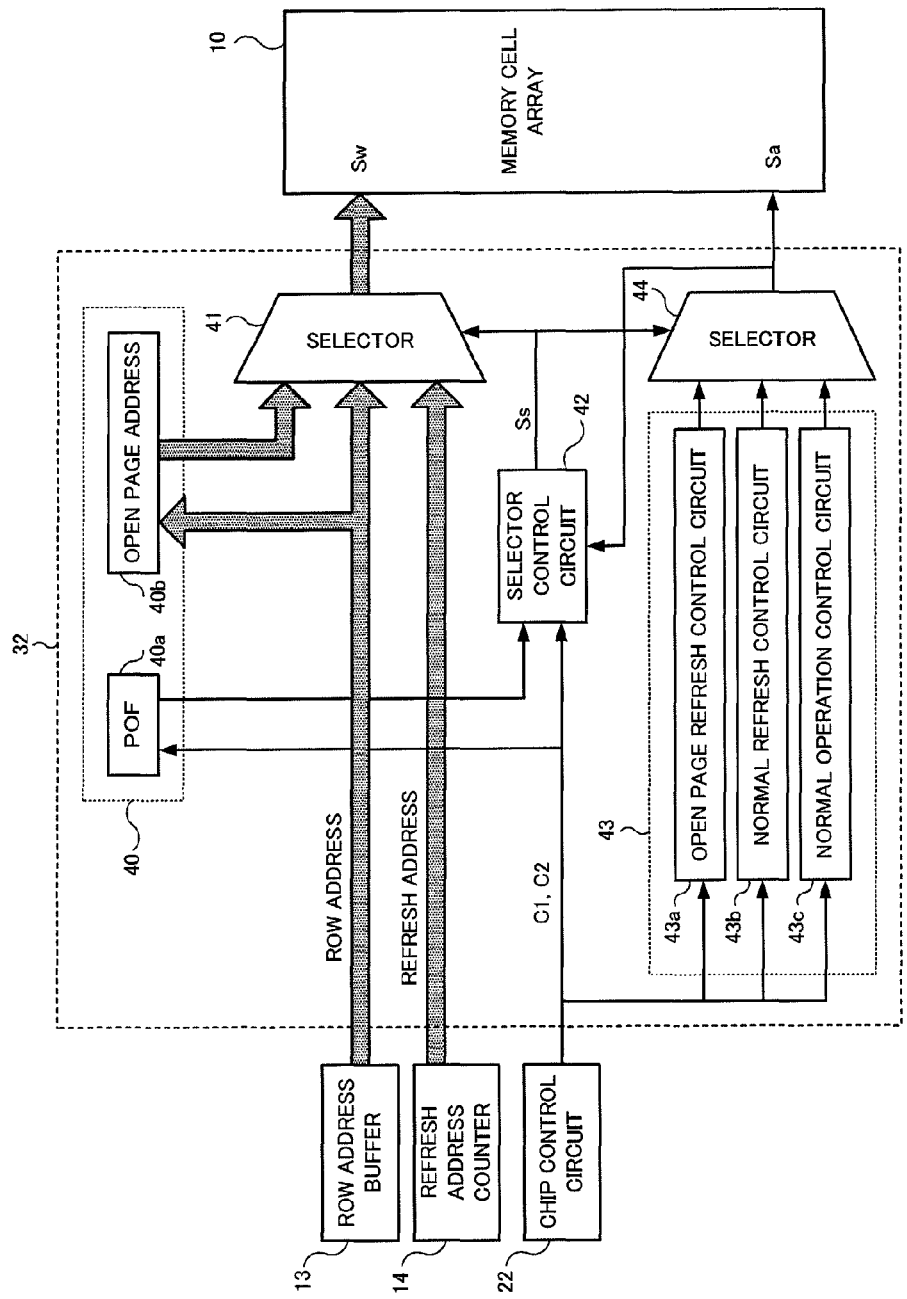
FIG. 7 is a diagram showing a specific configuration example of an array control circuit 32 for performing the refresh control of FIG. 6.

FIG. 7 shows a specific configuration example of the array control circuit 32 for performing the refresh control of FIG. 6. The array control circuit 32 shown in FIG. 7 includes control data registers 40 (the register of the invention), a selector 41 (the first selector of the invention), a selector control circuit 42, operation control circuits 43, and a selector 44 (the second selector the invention). The control data registers 40 includes a POF register 40a that stores a page open flag POF indicating whether or not the open page exists in the block BK to be refreshed, and an open page address register 40b that stores a row address corresponding to the open page existing in the block BK to be refreshed (open page address). The selector 41 receives the row address stored in the open page address register 40b, a row address stored in the row address buffer 13, and the refresh address generated by the refresh address counter 14, respectively, and outputs an address selected from those three addresses based on a select signal Ss as the word line select signal Sw to the memory cell array 10.

Meanwhile, the operation control circuits 43 includes an open page refresh control circuit 43a outputting a control signal required in the refresh control for a case when the open page exists (Steps S12 to S14), a normal refresh control circuit 43b outputting a control signal required in the refresh control for a case when the open page does not exist (Step S11), and a normal operation control circuit 43c outputting a control signal for a normal operation. The selector 44 receives the respective control signals of the open page refresh control circuit 43a, the normal refresh control circuit 43b and the normal operation control circuit 43c, and outputs an array control signal Sa selected based on the select signal Ss to the memory cell array 10. The selector control circuit 42 generates the select signal Ss based on the page open flag POF stored in the POF register 40a and the normal operation command C1 and the auto-refresh command C2 that are supplied from the chip control circuit 22, and outputs it to the selectors 41 and 44. In addition, the normal operation command C1 and the auto-refresh command C2 are also supplied to the POF register 40a and the operation control circuits 43 in addition to the selector control circuit 42.

Figure 8:
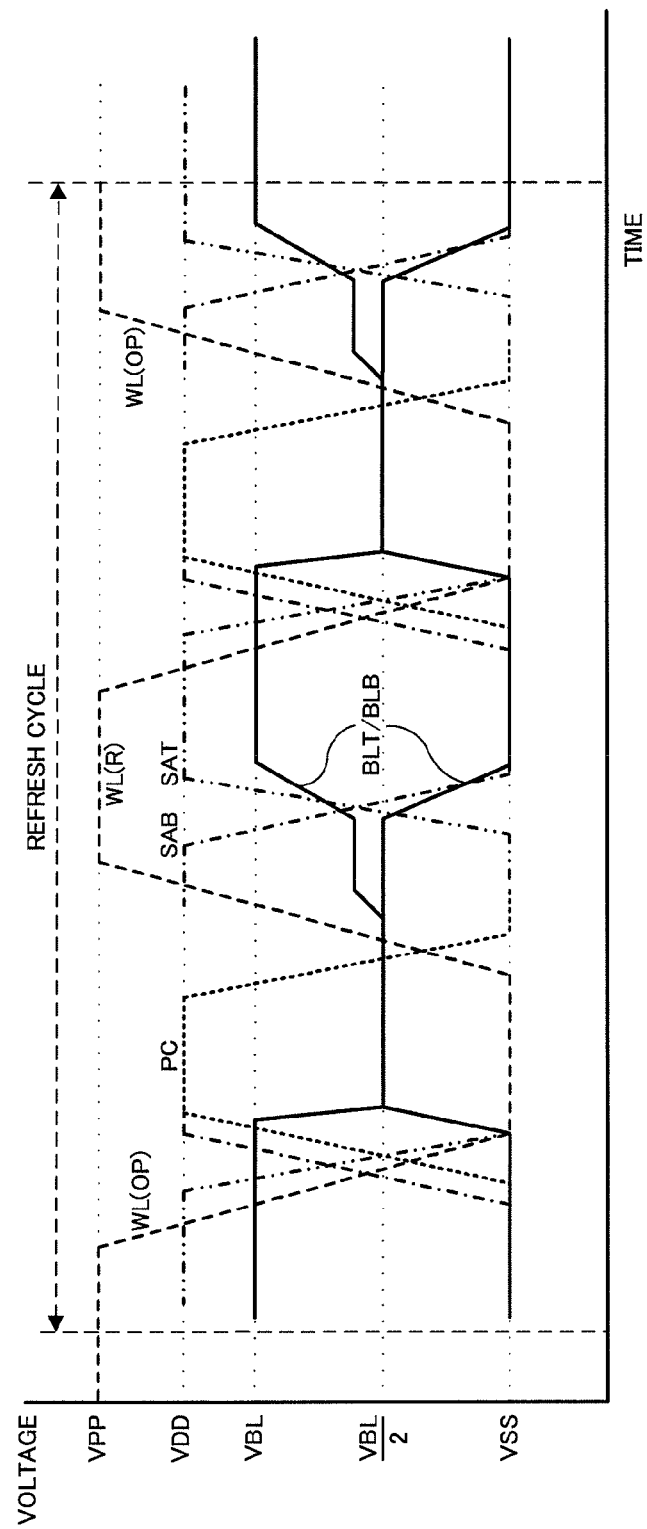
FIG. 8 is a signal waveform diagram in which an open page exists in the block BK to be refreshed.
Figure 9:
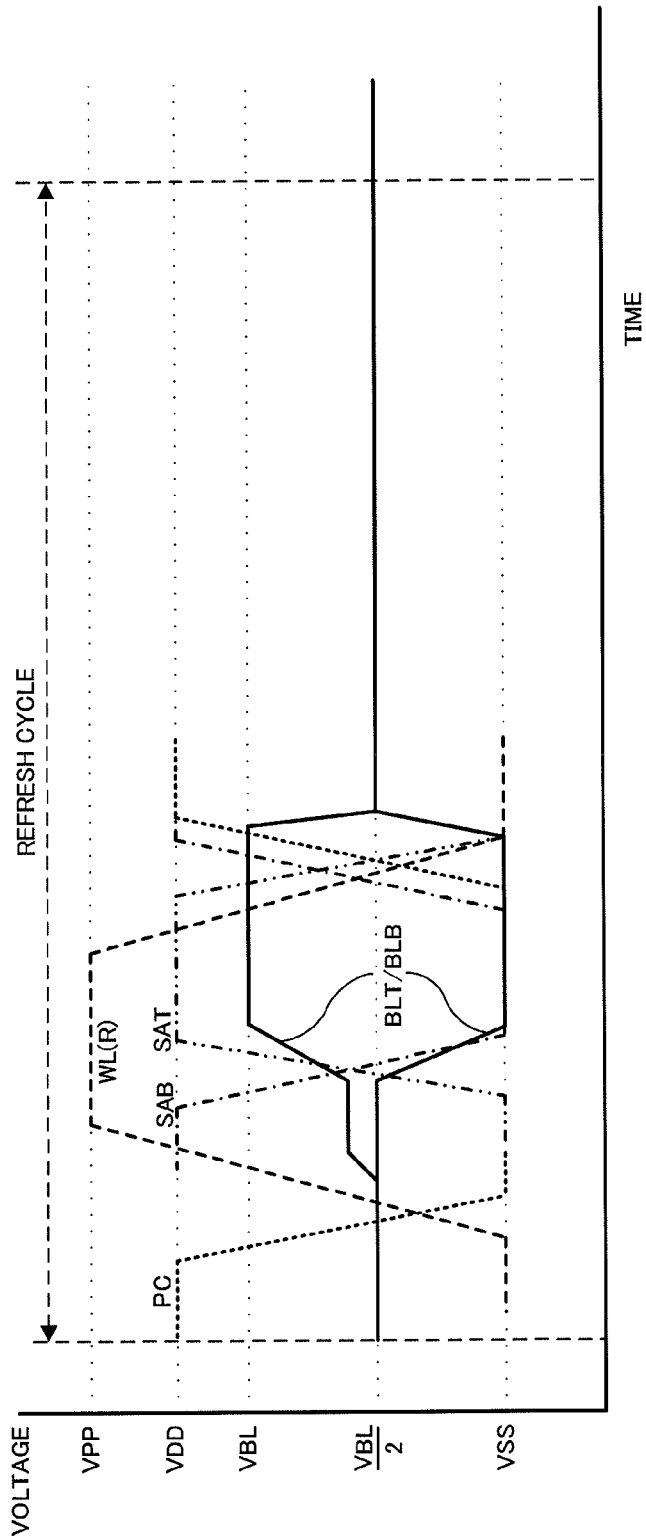
FIG. 9 is one example of a signal waveform diagram in which the open page does not exist in the block BK to be refreshed.
Figure 10:
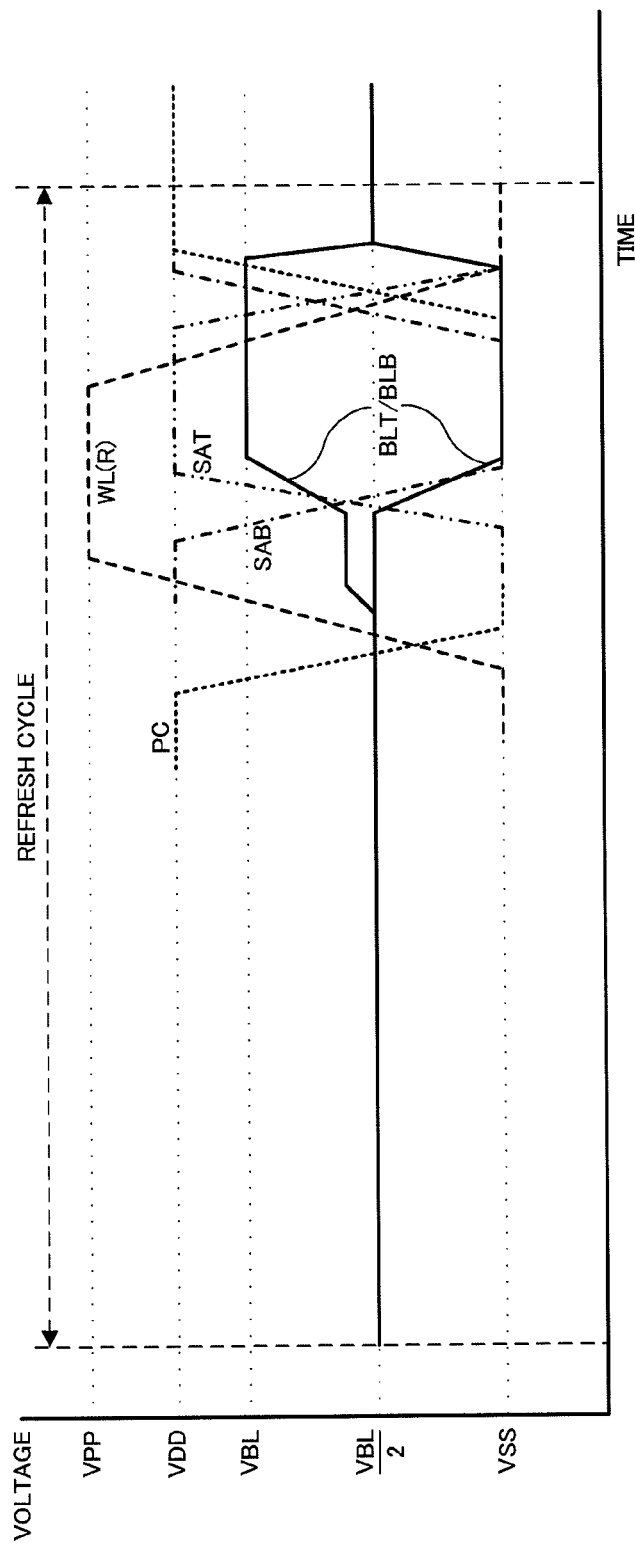
FIG. 10 is another example of the signal waveform diagram in which the open page does not exist in the block BK to be refreshed.

Here, signal waveforms in performing the refresh control of FIG. 6 in the DRAM of the first embodiment are shown in FIGS. 8 to 10. In FIGS. 8 to 10, signal waveforms of principal signals are compared within one refresh cycle during which one time refresh operation is performed for the block BK to be refreshed. In addition, the low level of the respective signals is the ground potential VSS, and high levels thereof are a boost voltage VPP for the word line WL, a supply voltage VDD for the sense amplifier control signals SAT, SAB and the precharge control signal PC, and the supply voltage VBL for the bit line BL, in descending order.

FIG. 8 shows signal waveforms in case where the open page exists in the block BK to be refreshed (Steps S12 to S14). First, in order to close the open page (Step S12), a word line WL(OP) corresponding to the open page is changed from "high" to "low" so as to be in a non-selected state, and the sense amplifier control signals SAT and SAB are controlled to be "low" and "high", respectively. Subsequently, the bit line pair BLT and BLB is precharged to the voltage VBL/2 by setting the precharge control signal PC to "high" for a certain period of time.

Thereafter, in order to start a refresh operation for the refresh page (Step S13), a word line WL(R) to be refreshed is driven to "high", and thereby a minute potential is read out from the memory cell MC to one of the bit line pair BLT and BLB. Then, by controlling the sense amplifier control signals SAT and SAB to be "high" and "low", respectively, the bit line pair BLT and BLB is sensed and amplified so that a voltage difference thereof becomes larger. Thereafter, the word line WL(R) to be refreshed is changed to "low" again, and the sense amplifier control signals SAT and SAB are controlled to be "low" and "high", respectively. Subsequently, the bit line pair BLT and BLB is precharged to the voltage VBL/2 again by setting the precharge control signal PC to "high" for a certain period of time, and the refresh operation completes at this point.

Further, in order to open the closed page again (Step S14), when the word line WL(OP) corresponding to the open page is driven to "high" again, a minute potential is read out to one of the bit line pair BLT and BLB again. Then, by controlling the sense amplifier control signals SAT and SAB to "high" and "low", respectively, the bit line pair BLT and BLB is sensed and amplified so that the voltage difference thereof becomes larger. Thereby, data of the open page can be extracted from the sense amplifier SA. Since the cycle time of the auto-refresh is a long period of time that is about twice that in a normal operation cycle, it is possible to perform the above-described operation within one refresh cycle.

FIG. 9 is one example of signal waveforms in case where the open page does not exist in the block BK to be refreshed (Step S11). The signal waveforms of FIG. 9 are obtained by performing the refresh operation in which the word line WL(R) to be refreshed is driven similarly as in FIG. 8 by using a first half of the refresh cycle. The signal waveforms of FIG. 9 are the same as partial signal waveforms of FIG. 8 and thus description thereof will be omitted.

FIG. 10 is another example of signal waveforms in case where the open page does not exist in the block BK to be refreshed (Step S11). The signal waveforms of FIG. 10 are obtained by performing the refresh operation in which the word line WL(R) to be refreshed is driven similarly as in FIG. 8 by using a second half of the refresh cycle. The signal waveforms of FIG. 10 are the same as those of FIG. 9 and thus description thereof will be omitted.

Although FIGS. 8 to 10 show the signal waveforms corresponding to the refresh operation for a specific block BK, the auto-refresh operation of the DRAM is generally performed for a plurality of blocks BK simultaneously. In this case, as shown in FIGS. 8 to 10, refresh operations for the respective blocks BK can be performed at staggered timings within each refresh cycle. By this, concentration of operating currents in the refresh operation can be avoided in each block BK, so that the operating currents can be dispersed and peak values thereof can be lowered. Thereby, power supply noise of the memory cell array 10 can be reduced, and the refresh operation can be stable.

According to the first embodiment as described above, assuming that only one page can be opened simultaneously in one block BK in the DRAM accessible based on open-page policy, even if a page in an open state exists when the auto-refresh command is issued, it is possible to complete the refresh operation within one refresh cycle without issuing another command. Accordingly, consumption current required in the refresh operation can be reduced, and access efficiency of the DRAM can be improved. These effects are basically common to the DRAM of second to fourth embodiments described below.

Second Embodiment

Figure 11:
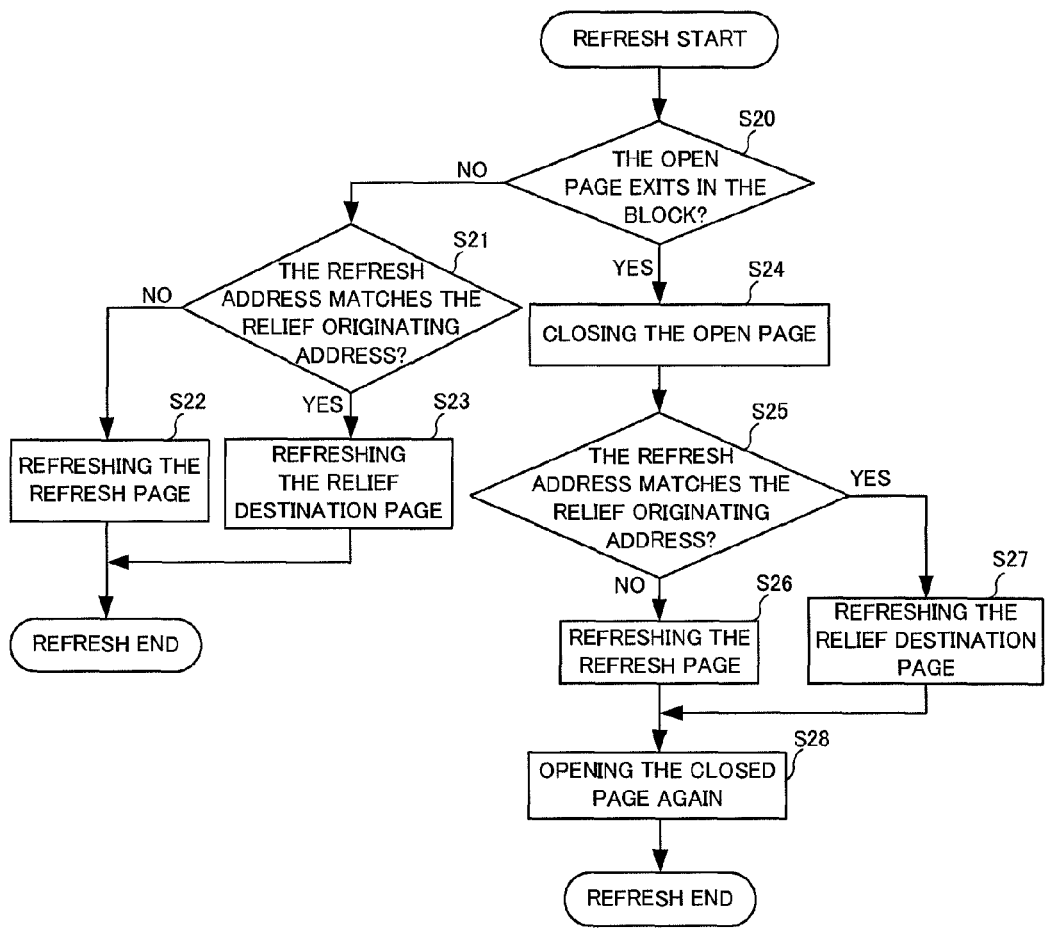
FIG. 11 is a flowchart showing a flow of a refresh control performed in the DRAM of a second embodiment.

In the DRAM of the second embodiment, a relief circuit that replaces a defective word line with a redundancy word line is added to the DRAM of the first embodiment. The configurations and operations of FIGS. 1 to 5 and 8 to 10 in the first embodiment are common in the second embodiment and thus description thereof will be omitted. FIG. 11 is a flow chart showing a flow of the refresh control performed in the DRAM of the second embodiment. In FIG. 11, Step S20 is performed in the same manner as Step S10 in the first embodiment.

Subsequently, if the open page does not exist in the block BK (Step S20: NO) in accordance with determination result of Step S20, it is determined whether or not the refresh address matches a relief originating address (Step S21). The relief originating address means a row address at which a defective word line has existed and relieved. If the determination result of Step S21 indicates that the refresh address does not match the relief originating address (Step S21: NO), the refresh operation for the refresh page is performed (Step S22) similarly as in Step S11 of FIG. 6. On the other hand, if the refresh address matches the relief originating address (Step S21: YES), a replaced word line WLa as a relief destination (hereinafter, referred to as "relief destination page") is selected so that the refresh operation is performed (Step S23), and the refresh control of FIG. 11 completes.

On the other hand, if the determination result of Step S21 indicates that the open page exists in the block BK (Step S20: YES), the open page is closed (Step S24) similarly as in Step S12 of FIG. 6, and subsequently it is determined whether or not the refresh address matches the relief originating address (Step S25). In accordance with determination result of Step S25, the refresh operation for the refresh address or the relief destination address is performed (Steps S26 and S27) similarly as in Steps S22 and S23. Thereafter, the closed page is opened again (Step S28) similarly as in Step S14 of FIG. 6, and the refresh control of FIG. 11 completes. It is possible to employ a modification of this refresh control, in which the determinations in Steps S21 and S25 can be performed together before Step S20 or in parallel with Step S20 simultaneously.

Figure 12:
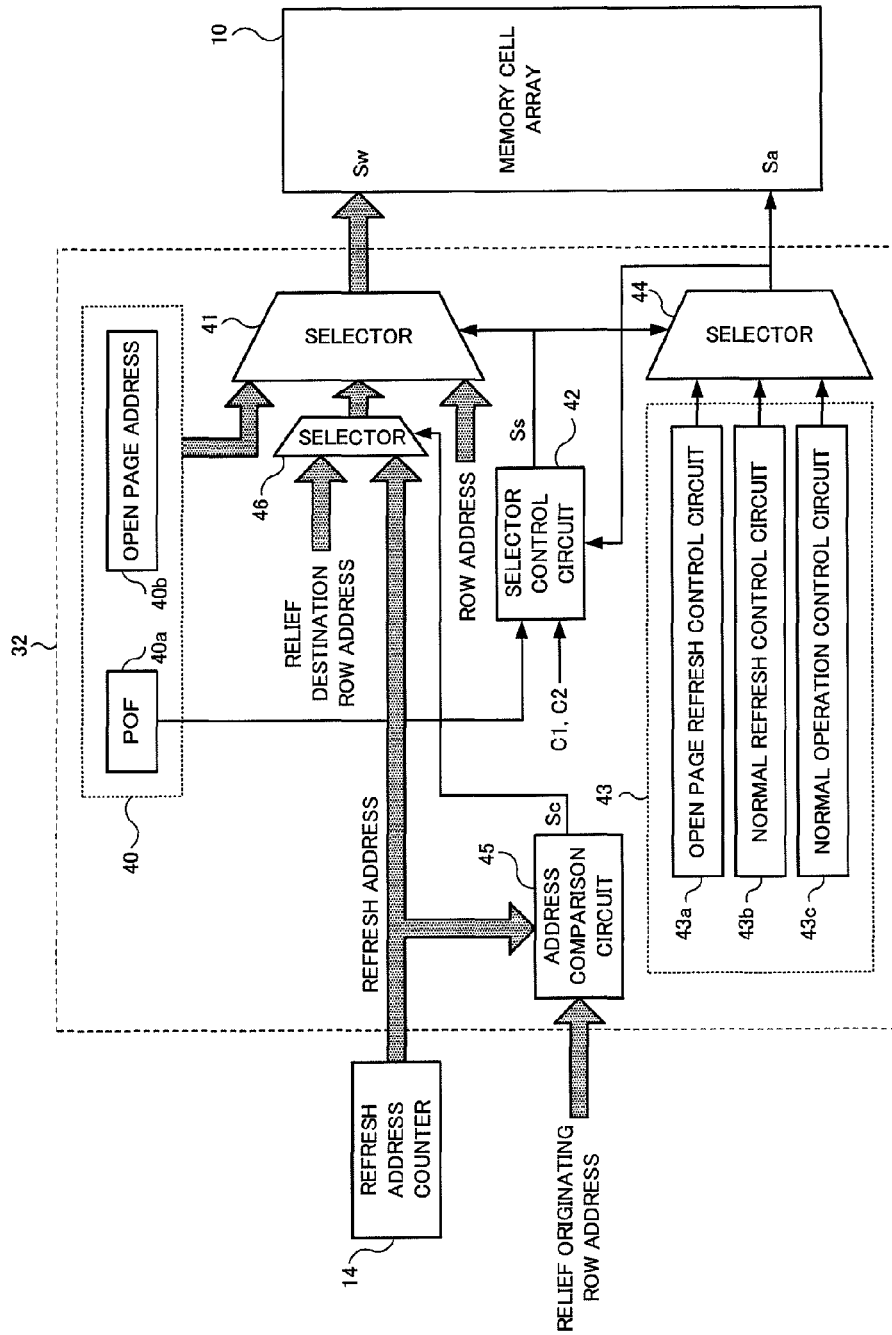
FIG. 12 is a diagram showing a specific configuration example of the array control circuit 32 in the DRAM of the second embodiment.

FIG. 12 shows a specific configuration example of the array control circuit 32 of the second embodiment. In the array control circuit 32 of FIG. 12, the control data registers 40, the selector 41, the selector control circuit 42, the operation control circuits 43 and the selector 44 are common to those in FIG. 7 of the first embodiment. The array control circuit 32 of FIG. 12 differs from FIG. 7 in that an address comparison circuit 45 and a selector 46 are provided in addition to the above-mentioned elements. The address comparison circuit 45 is used for the determinations in Steps S21 and S25 of FIG. 11, compares the refresh address and a relief originating row address, and outputs a match signal Sc indicating whether or not the both addresses match each other. The selector 46 receives a relief destination row address and the refresh address, selects one of the addresses based on the match signal Sc outputted from the address comparison circuit 45, and outputs the selected address to the selector 41. By using the array control circuit 32 having such a configuration, the refresh control of FIG. 11 can be performed.

Third Embodiment

Figure 13:
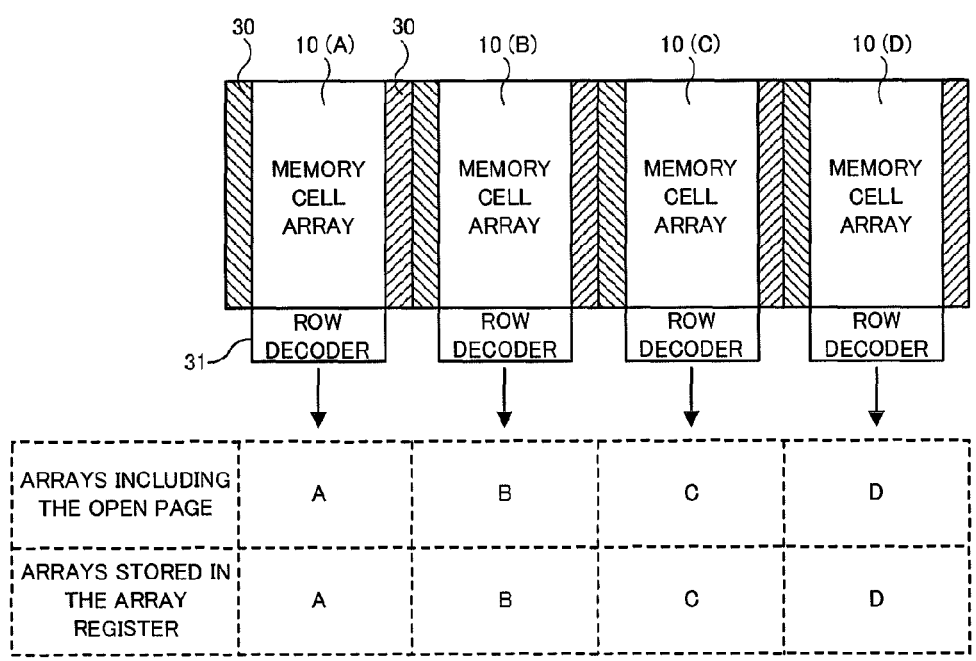
FIG. 13 is a diagram showing a first setting example of an array register AR in the DRAM of a third embodiment.

Although the refresh control corresponding to the existence of the open page is performed for each block BK in the DRAM of the first and second embodiments, the DRAM of the third embodiment is modified so that the same refresh control is performed for each memory cell array 10. FIG. 13 shows a first setting example of an array register AR (refer to FIG. 20) in the DRAM of the third embodiment. The array register AR is provided in the control data registers 40 of the array control circuit 32, and stores information required for performing the refresh control of the third embodiment. Specifically, when stored data in the memory cell MC corresponding to the open page is sensed and amplified by a predetermined sense amplifier SA, array address information identifying all memory cell arrays 10 to which word lines WL sharing the predetermined sense amplifier SA belong is stored in the array register AR.

Four memory cell arrays 10(A), 10(B), 10(C) and 10(D) are shown in the upper side of FIG. 13, and each of the memory cell arrays 10 has the same configuration as that in FIG. 4. This example is configured so that word lines WL (pages) belonging to different memory cell arrays 10 do not share sense amplifiers SA in each sense amplifier row 30, including a case where the memory cell arrays 10 are adjacent to each other. Thus, the memory cell array 10 including the open page and the array address information of the memory cell array 10 stored in the array register AR correspond to each other one-to-one. For example, as shown in the lower side of FIG. 13, the memory cell arrays 10 including the open page are represented as "A", "B", "C", "D" from the left, and the same information is stored in the array register AR.

Figure 14:
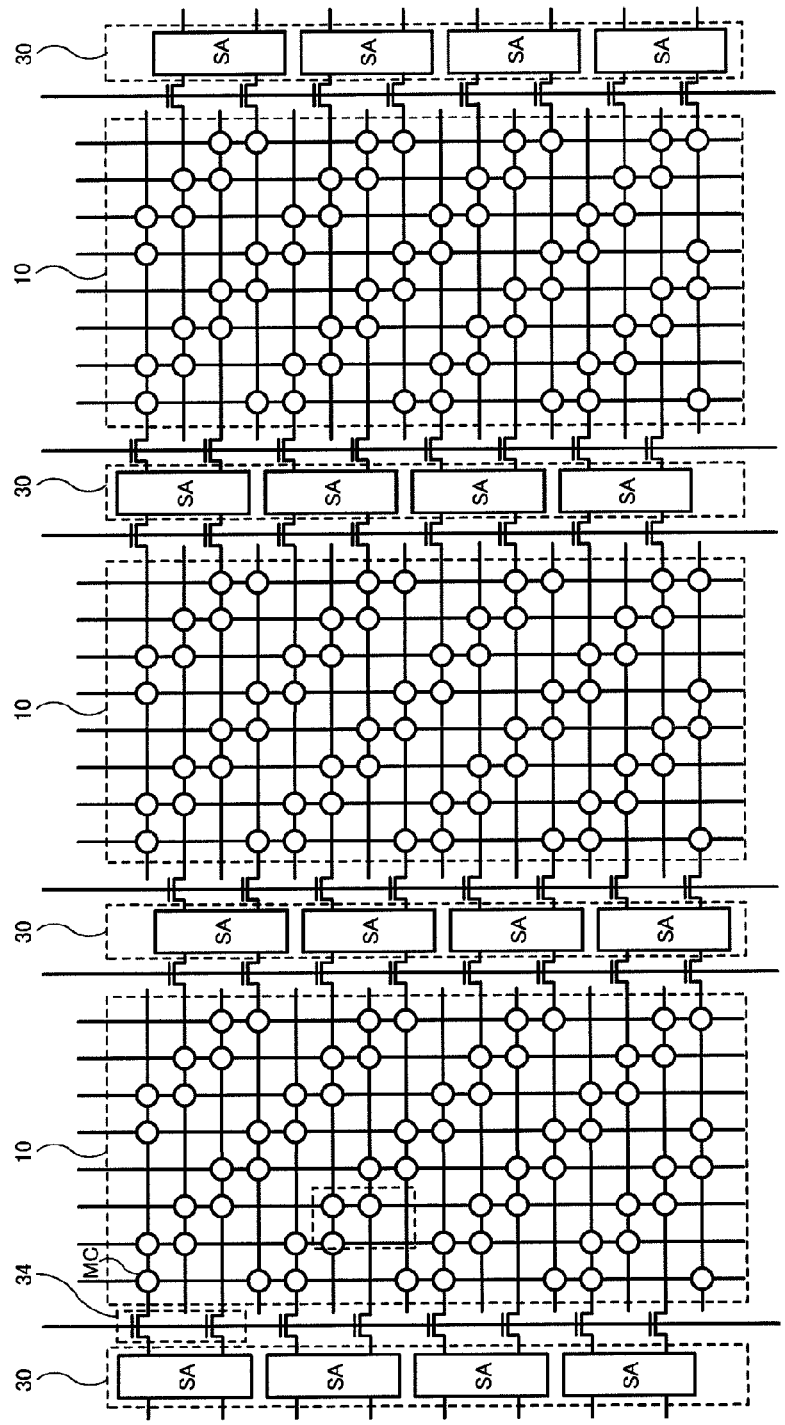
FIG. 14 is a diagram showing a second configuration example of the memory cell array 10 in the DRAM of the third embodiment.

FIG. 14 shows a second configuration example of the memory cell array 10 in the DRAM of the third embodiment. In FIG. 14, each memory cell array 10 is configured in the same manner as in FIG. 4 of the first embodiment. Meanwhile, each sense amplifier row 30 is shared by adjacent two memory cell arrays 10. That is, each sense amplifier SA in the sense amplifier row 30 is capable of being selectively connected to a complementary bit line pair of one memory cell array 10 and a complementary bit line pair of the other memory cell array 10. Therefore, switch circuits 34 are arranged on both sides of the sense amplifier row 30. Each pair of MOS transistors included in the switch circuit 34 is connected between the complementary bit line pair and the sense amplifier SA, and is switched in response to a control signal.

Figure 15:
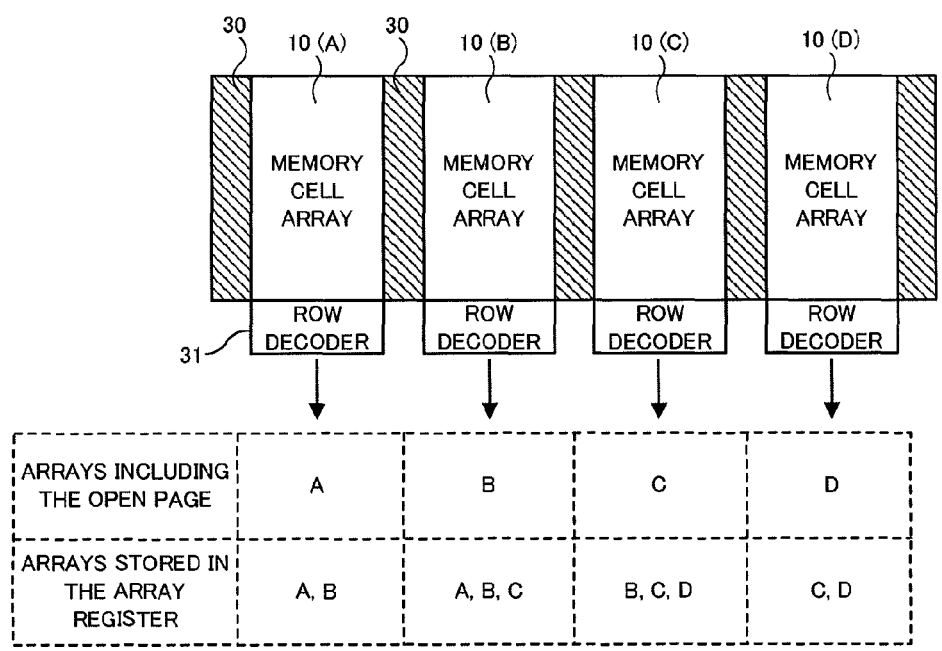
FIG. 15 is a diagram showing a setting example of the array register AR corresponding to the second configuration example shown in FIG. 14.

FIG. 15 shows a setting example of the array register AR corresponding to the second configuration example shown in FIG. 14. In this example, since adjacent memory cell arrays 10 share the sense amplifier row 30 therebetween, the memory cell array 10 including the open page does not correspond to the array address information of the memory cell arrays 10 stored in the array register AR. For example, when the open page belongs to the memory cell array 10(B) at the second position from the left, the array address information indicating three memory cell arrays 10 (represented as "A, B, C") including the memory cell array 10(B) and adjacent memory cell arrays 10(A) and 10(C) is stored in the array register AR.

Figure 16:
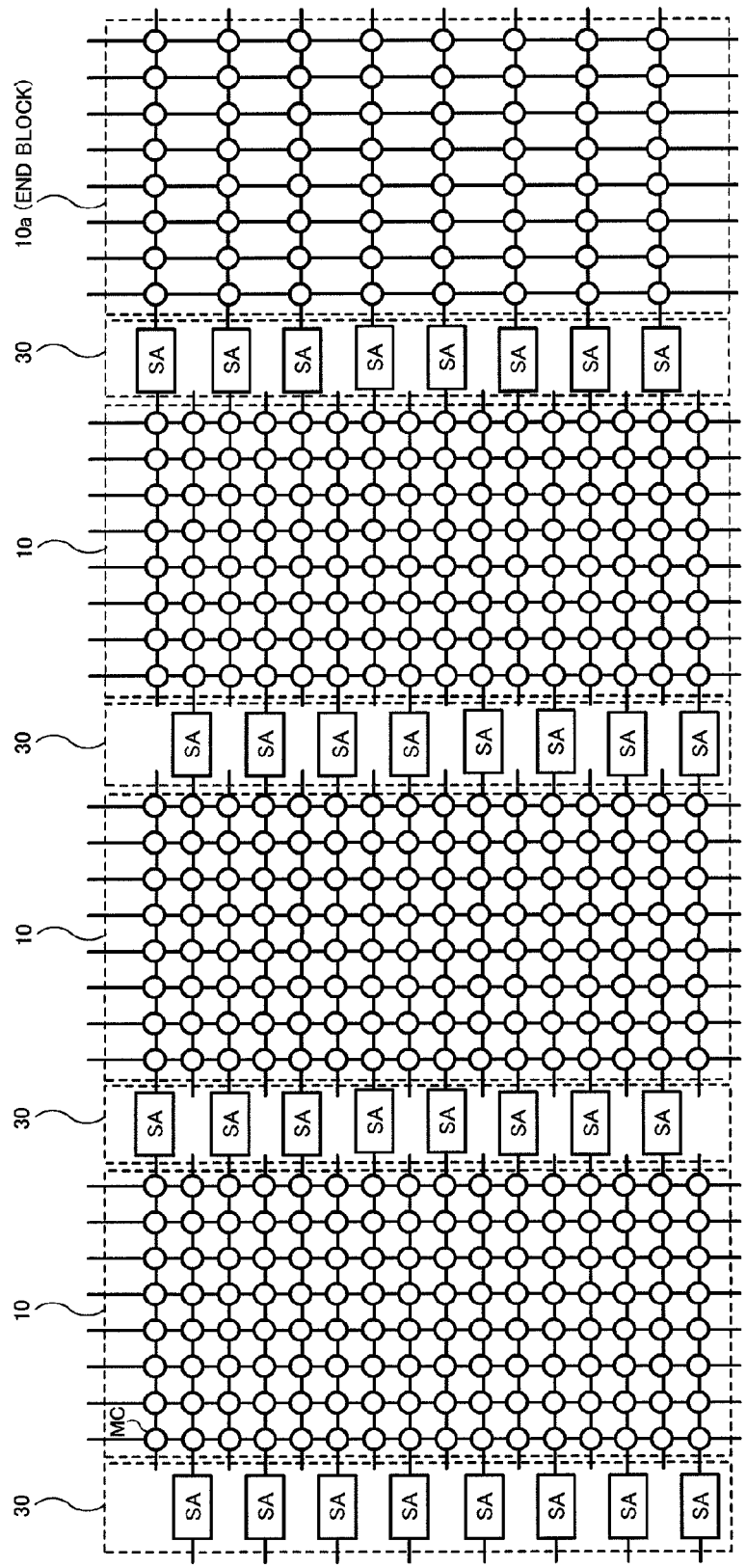
FIG. 16 is a diagram showing a third configuration example of the memory cell array 10 in the DRAM of the third embodiment.

FIG. 16 shows a third configuration example of the memory cell array 10 in the DRAM of the third embodiment. The third configuration example has memory cell arrays 10 of an open bit line structure, in which memory cells MC are arranged at all intersections of the word lines WL and the bit lines BL in each memory cell array 10. Further, each sense amplifier SA in the sense amplifier rows 30 is connected to two bit lines BL of memory cell arrays 10 on both sides, and the two bit lines BL form a complementary bit line pair. Furthermore, for the purpose of loosening a layout pitch, the sense amplifiers SA are arranged in a zigzag alignment in each of the sense amplifier rows 30 on both sides of the memory cell array 10. Thus, in each of end blocks 10a (only one end block 10a is shown in FIG. 16) located at both ends of a plurality of memory cell arrays 10, the number of bit lines BL is half that in other memory cell arrays 10. Corresponding word lines WL in the two end blocks 10a located at both ends are simultaneously selected, and these two end blocks 10a function together as one memory cell array 10.

Figure 17:
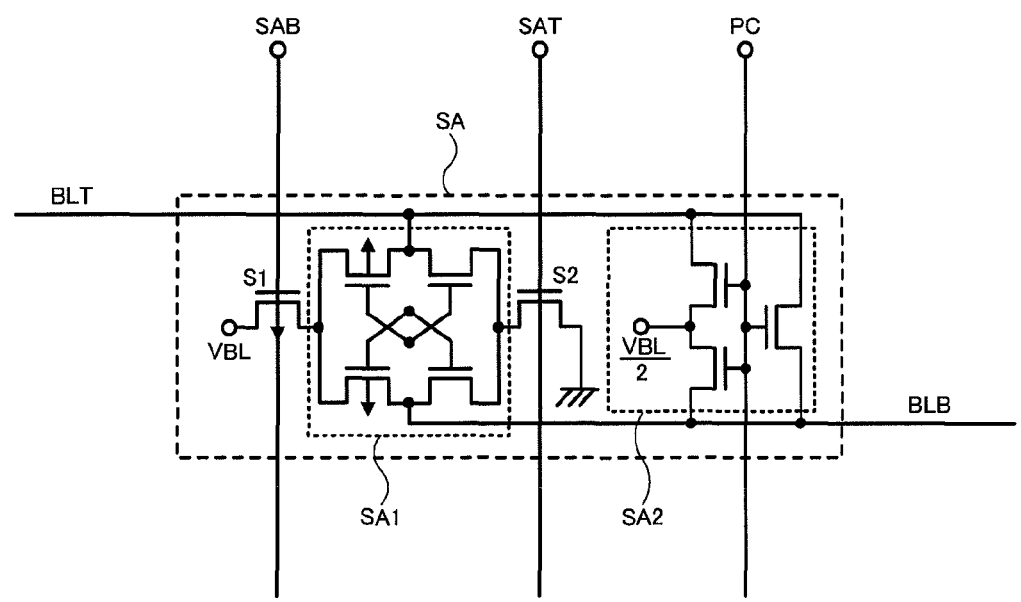
FIG. 17 is a diagram showing a circuit configuration example of the sense amplifier SA in the third configuration example shown in FIG. 16.

FIG. 17 shows a circuit configuration example of the sense amplifier SA in the third configuration example shown in FIG. 16. The sense amplifier SA shown in FIG. 17 has the same circuit configuration as in FIG. 5 of the first embodiment, and however two bit lines BLT and BLB forming the complementary bit line pair extend in different directions.

Figure 18:
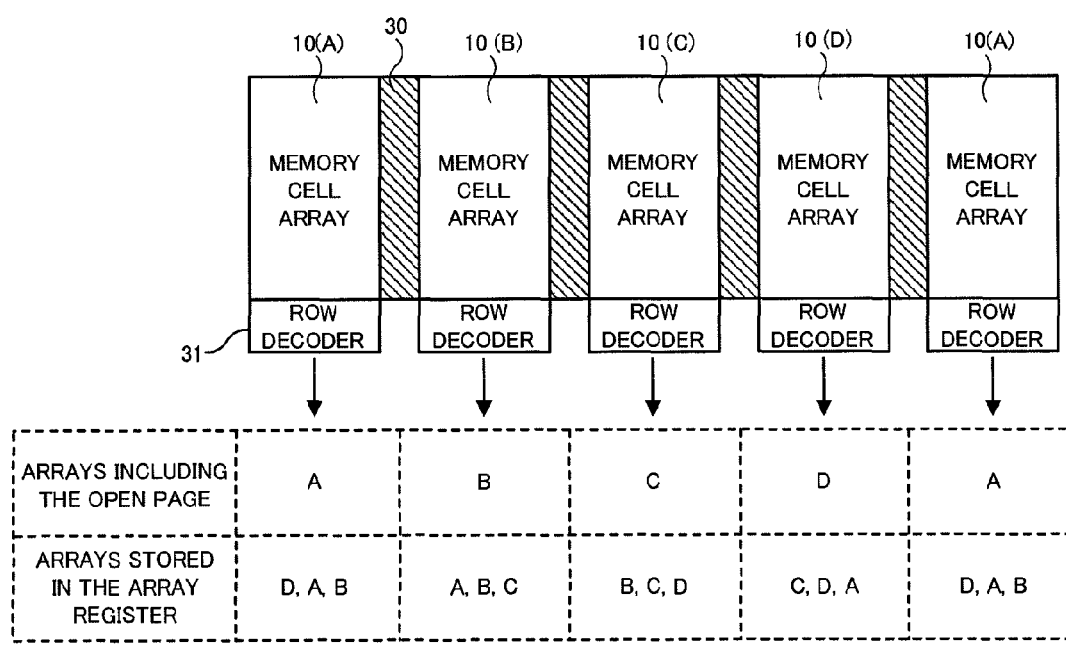
FIG. 18 is a diagram showing a setting example of the array register AR in the third configuration example shown in FIG. 16.

FIG. 18 shows a setting example of the array register AR corresponding to the third configuration example shown in FIG. 16. In this example, the adjacent memory cell arrays 10 share the sense amplifier row 30 therebetween, and the two end blocks 10a at the both ends function as one memory cell array 10(A). Other memory cell arrays 10(B), 10(C) and 10(D) are common to those in FIG. 15. For example, when the open page belongs to the memory cell array 10(A), the array address information indicating three memory cell arrays 10 (represented as "D, A, B") including the memory cell array 10(A) and memory cell arrays 10(B) and 10(D) adjacent to the two end blocks 10a is stored in the array register AR.

Figure 19:
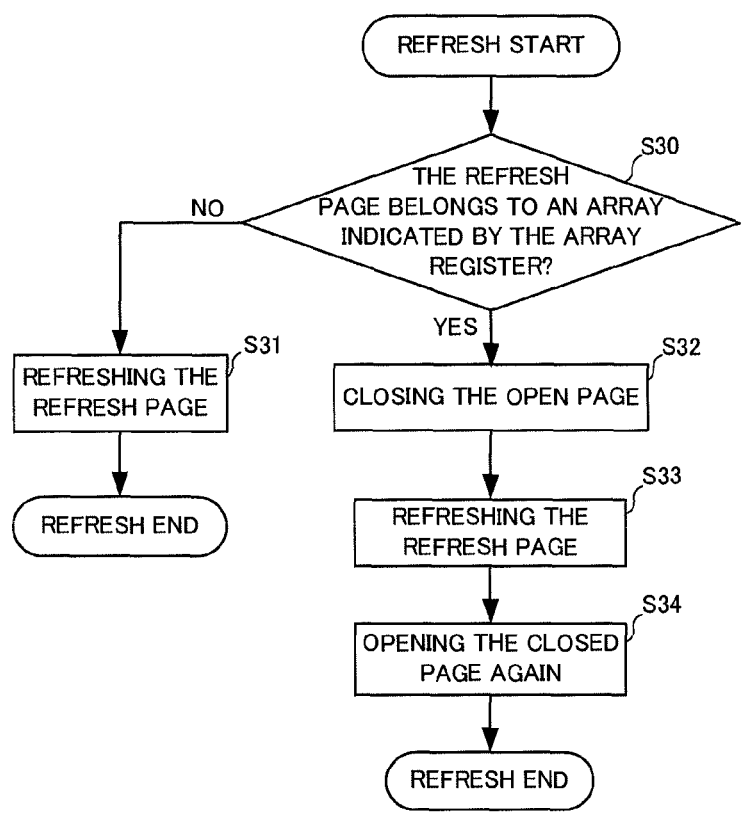
FIG. 19 is a flowchart showing a flow of a refresh control performed in the DRAM of the third embodiment.

FIG. 19 is a flow chart showing a flow of the refresh control performed in the DRAM of the third embodiment. In many respects, the refresh control of FIG. 19 is common to that in FIG. 6 of the first embodiment, and however a difference exists in that the existence of the open page is determined for each memory cell array 10 in the third embodiment, not for each block BK. That is, when the control of FIG. 19 is started, it is determined whether or not the refresh page belongs to a memory cell array 10 indicated by the array address information by referring this information stored in the array register AR (Step S30). Processes of Steps S31 to S34 after Step S30 are performed in the same manner as Steps S11 to S14 of FIG. 6, so description thereof will be omitted.

Figure 20:
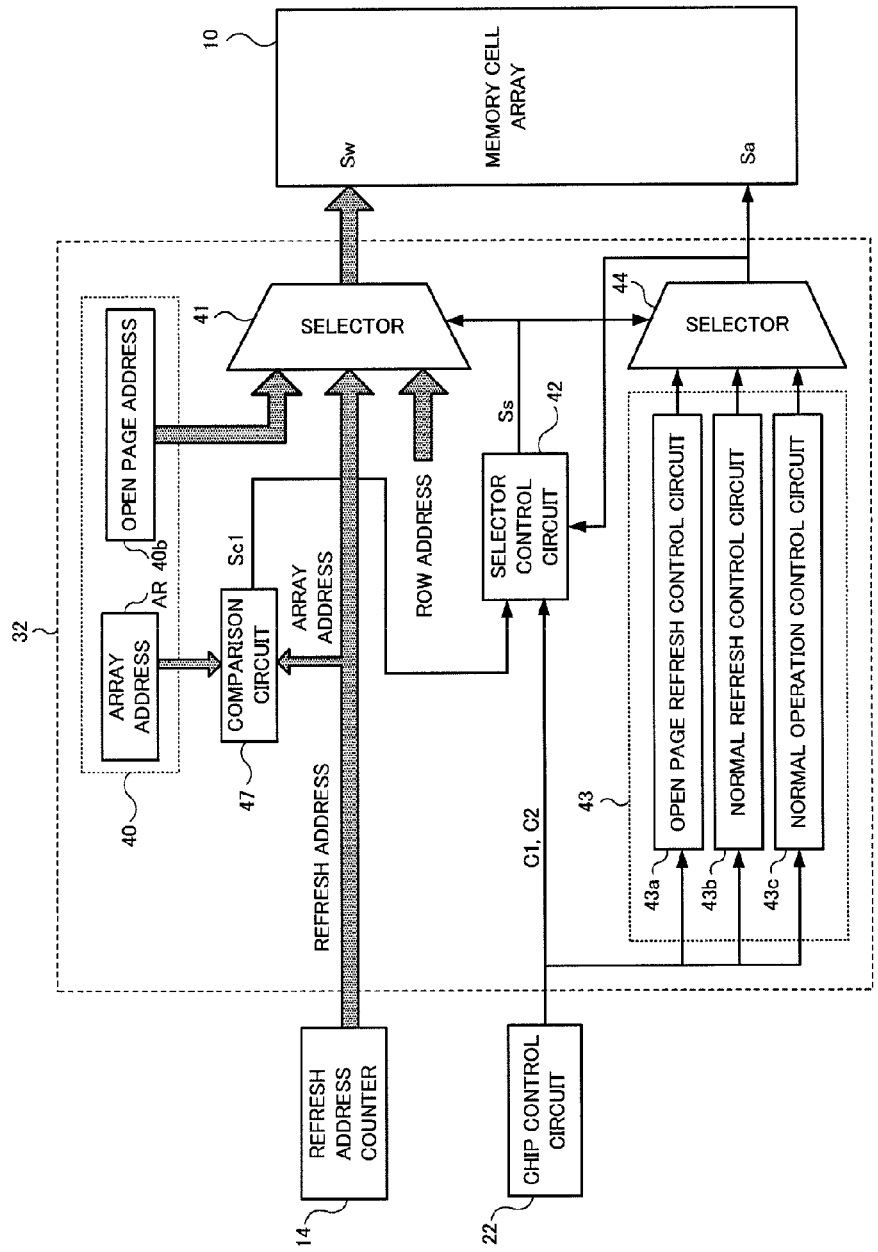
FIG. 20 is a diagram showing a specific configuration example of the array control circuit 32 in the DRAM of the third embodiment.

FIG. 20 shows a specific configuration example of the array control circuit 32 of the third embodiment. In the array control circuit 32 of FIG. 20, the selector 41, the selector control circuit 42, the operation control circuits 43 and the selector 44 are common to those in FIG. 7 of the first embodiment. The array control circuit 32 of FIG. 20 differs from FIG. 7 in that the control data registers 40 includes the above-mentioned array register AR instead of the POF register 40a of FIG. 7 and that a comparison circuit 47 is provided. The comparison circuit 47 is used for the determination in Step S30 of FIG. 19, compares the array address information stored in the array register AR and an array address included in the refresh address, and outputs a match signal Sc1 indicating whether or not the both addresses match each other. When the both addresses match, the match signal Sc1 is used in the selector control circuit 42 instead of using the page open flag POF of FIG. 7. Other elements are the same as in FIG. 7, so description thereof will be omitted.

Fourth Embodiment

Figure 21:
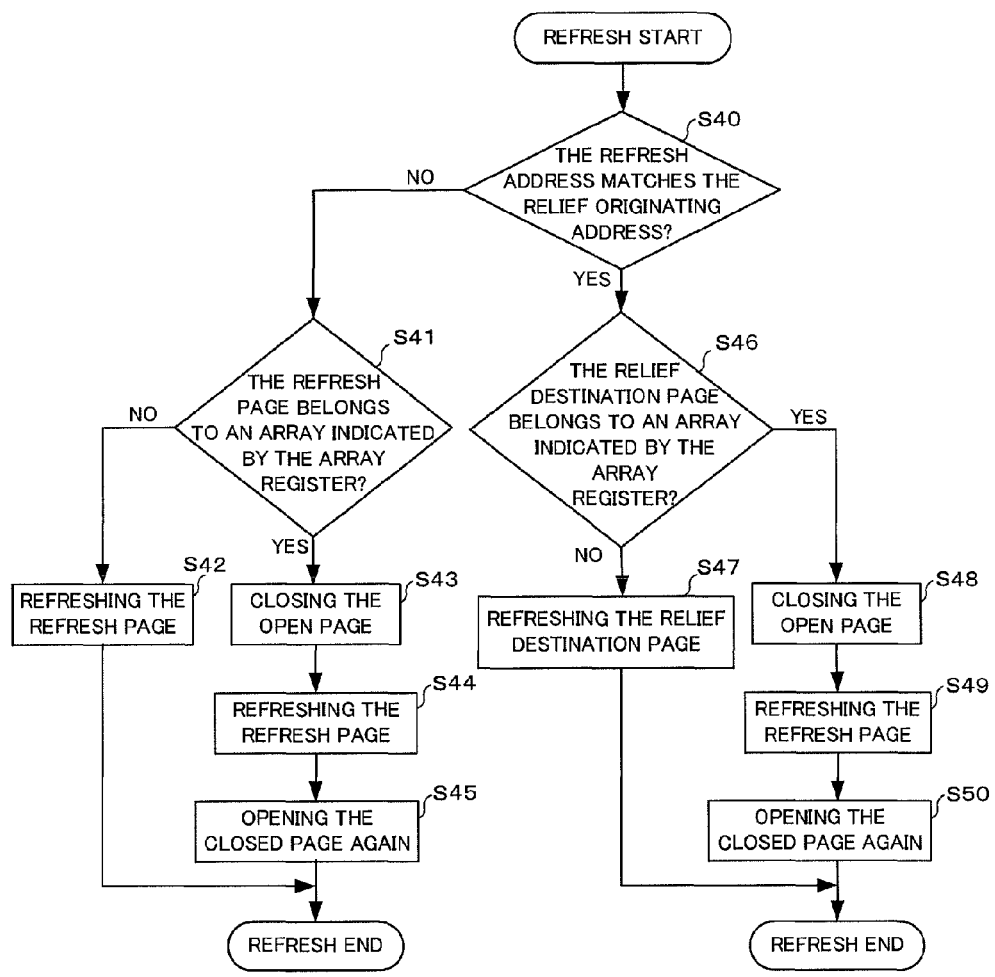
FIG. 21 is a flowchart showing a flow of a refresh control performed in the DRAM of a fourth embodiment.

In the DRAM of the fourth embodiment, the relief circuit that replaces the defective word line with the redundancy word line is added to the DRAM of the third embodiment. The configurations and operations of FIGS. 1 to 5, 8 to 10 of the first embodiment and FIGS. 13 to 18 of the second embodiment are common in the fourth embodiment and thus description thereof will be omitted. FIG. 21 is a flow chart showing a flow of the refresh control performed in the DRAM of the fourth embodiment. When the control of FIG. 21 is started, it is determined whether or not the refresh address matches the relief originating address (Step S40). This Step S40 is the same process as Steps S21 and S25 (FIG. 11) of the second embodiment. If the determination result of Step S40 indicates that the refresh address does not match the relief originating address (Step S40: NO), it is determined whether or not the refresh page belongs to the memory cell array 10 indicated by the array address information in the array register AR (Step S41). Processes of Steps S41 and subsequent Steps S42 to S45 are performed in the same manner as Steps S30 to S34 (FIG. 19) of the third embodiment. Thereafter, the refresh control of FIG. 21 completes.

Meanwhile, if the determination result of Step S40 indicates that the refresh address matches the relief originating address (Step S40: YES), it is determined whether or not the relief destination page belongs to the memory cell array 10 indicated by the array address information in the array register AR (Step S46). Process of Steps S47 to S50 performed in accordance with the determination result of Step S46 correspond to a case where the refresh page is replaced with the relief destination page in the above processes of Steps S42 to S45. Thereafter, the refresh control of FIG. 21 completes.

Figure 22:
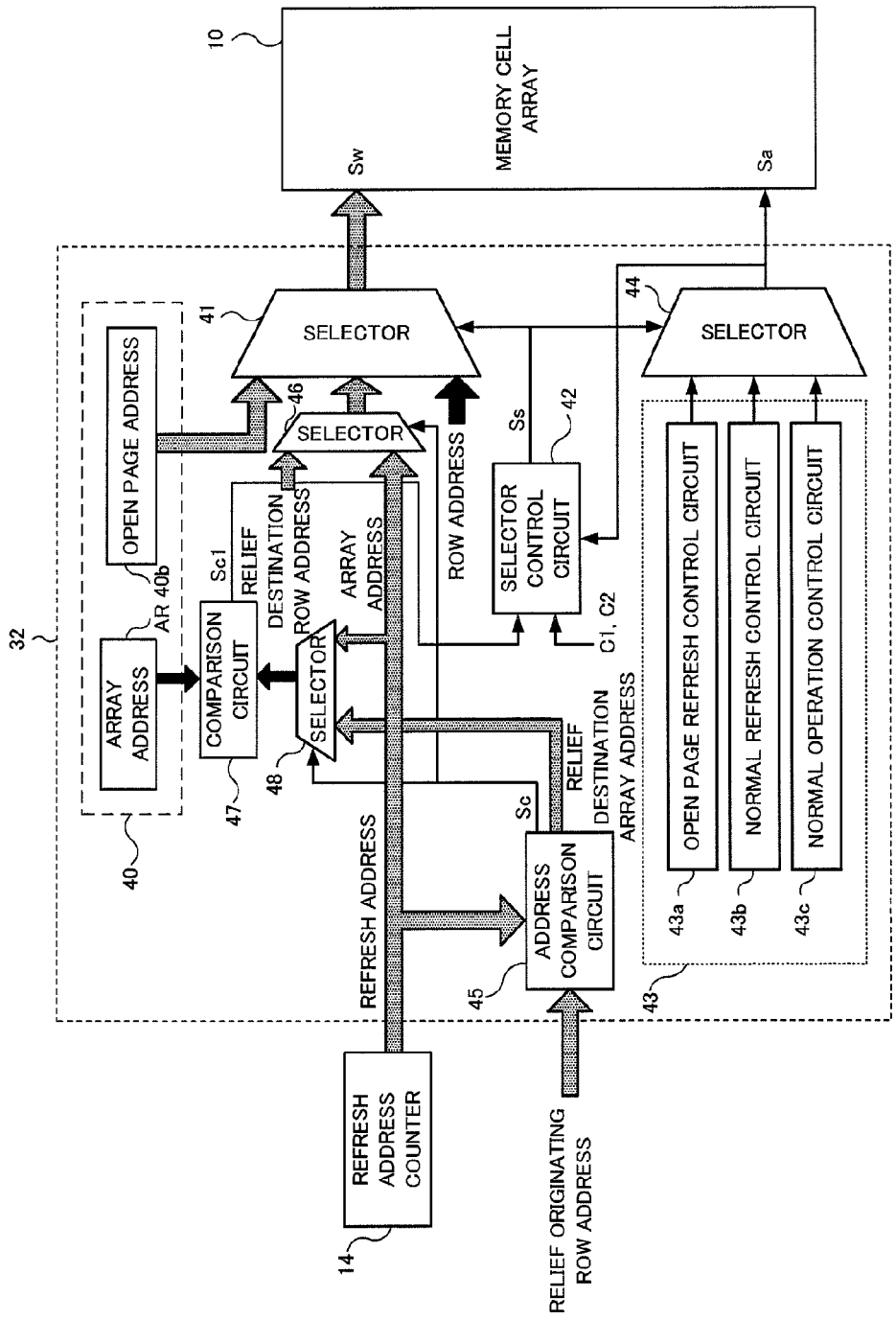
FIG. 22 is a diagram showing a specific configuration example of the array control circuit 32 in the DRAM of the fourth embodiment.

FIG. 22 shows a specific configuration example of the array control circuit 32 of the fourth embodiment. In the array control circuit 32 of FIG. 22, the control data registers 40, the selector 41, the selector control circuit 42, the operation control circuits 43 and the comparison circuit 47 are common to those in FIG. 20 of the third embodiment. The array control circuit 32 of FIG. 22 differs from FIG. 20 in that an address comparison circuit 45 and selectors 46 and 48 are provided in addition to the above-mentioned elements. The address comparison circuit 45 has the same configuration as that of the address comparison circuit 45 of FIG. 12 in the second embodiment, additionally outputs the match signal Sc to the selector 48, and further outputs a relief destination array address to the selector 48. The selector 46 has the same configuration as that of the selector 46 of FIG. 12 in the second embodiment. Further, the selector 48 selects either one of the relief destination array address and an array address included in the refresh address based on the match signal Sc, and outputs the selected address to the comparison circuit 47. By using the array control circuit 32 having such a configuration, the refresh control of FIG. 21 can be performed

[Conditions of Simultaneous Refreshing in the Auto-Refresh Operation]

The auto-refresh operation in the above embodiments is performed for the plurality of word lines WL (pages) simultaneously in an area of the memory chip C of FIG. 2. Memory cell arrays 10 including pages as a target of the simultaneous refresh can be arranged under various conditions. In the following, two arrangement examples in which four word lines WL (four pages) are the target of the simultaneous refresh will be described.

Figure 23:
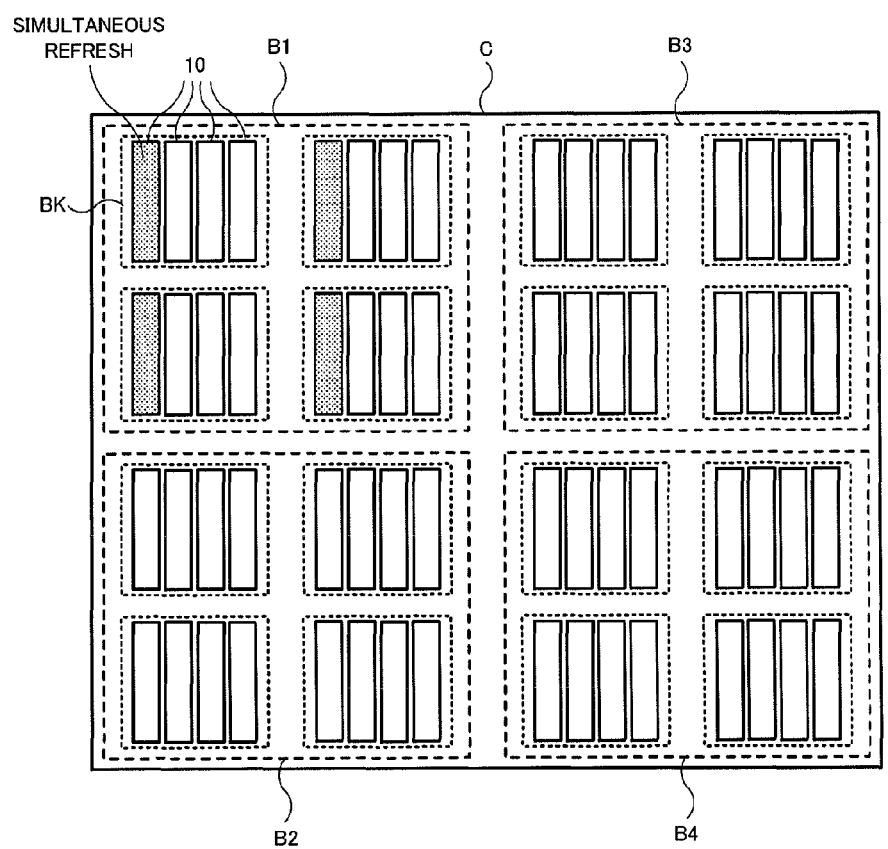
FIG. 23 is a diagram showing a first arrangement example showing a condition of a simultaneous refresh in an auto-refresh operation.

FIG. 23 shows a first arrangement example showing a condition of the simultaneous refresh in the auto-refresh operation. In the first arrangement example shown in FIG. 23, four memory cell arrays 10 each including the target page for the simultaneous refresh are separately arranged in respective four blocks BK in one bank. The number of pages capable of being opened in each bank is limited to one. Thus, only one memory cell array 10 can be the target of the open page refresh (for example, Steps S12 to S14 of FIG. 6) in the bank to be refreshed. Here, consumption current in the refresh operation for the open page becomes twice as large as that in the normal refresh operation. Therefore, even when the consumption current doubles in only one of the four memory cell arrays 10 in the auto-refresh operation, an increase in consumption current can be suppressed up to 25%. However, memory cell arrays 10 activated in the auto-refresh operation concentrate in one bank, and thus power supply noise correspondingly increases.

Figure 24:
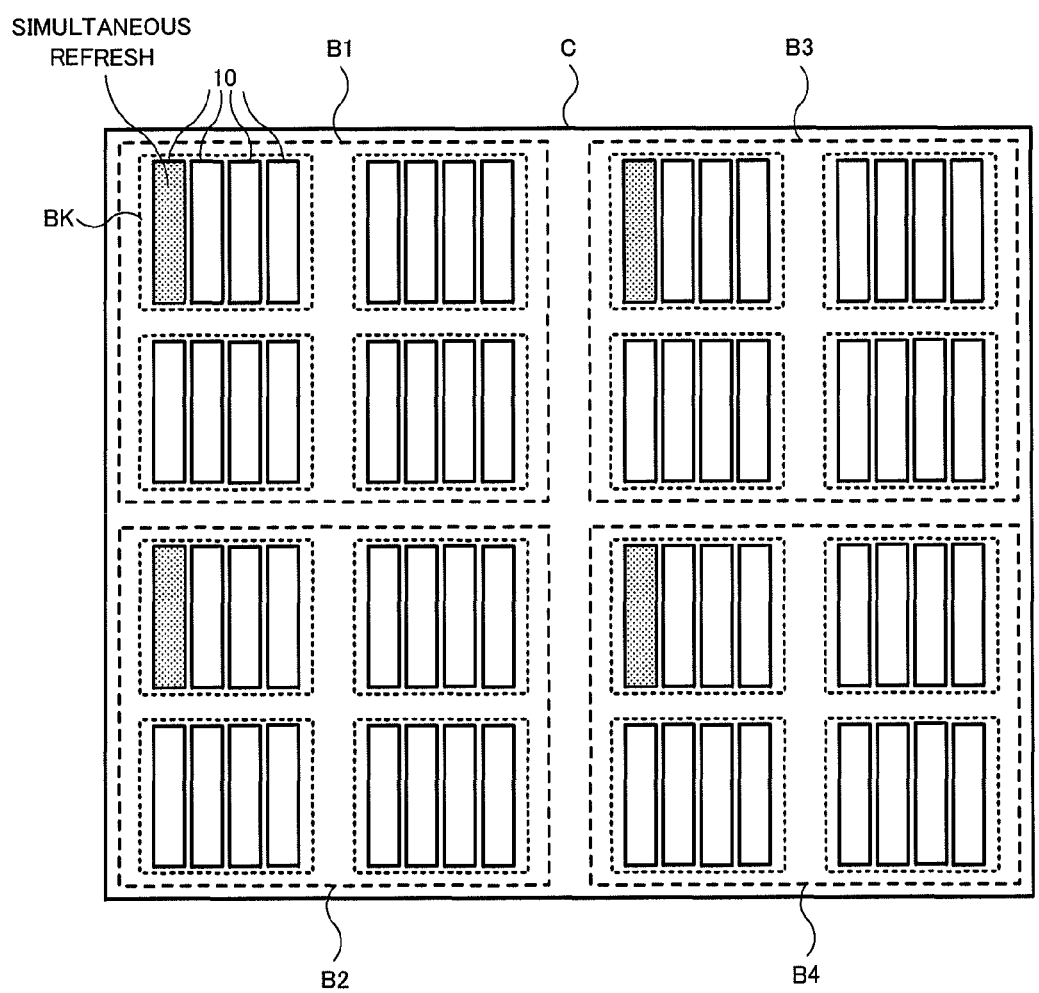
FIG. 24 is a diagram showing a second arrangement example showing a condition of the simultaneous refresh in the auto-refresh operation.

FIG. 24 shows a second arrangement example showing a condition of the simultaneous refresh in the auto-refresh operation. In the second arrangement example shown in FIG. 24, four memory cell arrays 10 each including the target page for the simultaneous refresh are separately arranged in four blocks BK in total, each of which is in a separate one of four banks. In this case, a case is assumed with a small probability in which all the four memory cell arrays 10 including the target page of the simultaneous refresh become targets of the above open page refresh. The consumption current in the auto-refresh operation in this case is maximally increased to twice that in the normal refresh operation. However, since memory cell arrays 10 activated in the auto-refresh operation do not concentrate in one bank, the power supply noise can be decreased.

In addition, the conditions to arrange the memory cell arrays 10 including the target of the simultaneous refresh operation are not limited to the arrangement examples of FIGS. 23 and 24, and arrangements obtained by combining these conditions can be available. Further, the number of memory cell arrays 10 is not limited to 4, and 2 to 16 memory cell arrays 10 can be the target of the simultaneous refresh.

[Computer System]

Figure 25:
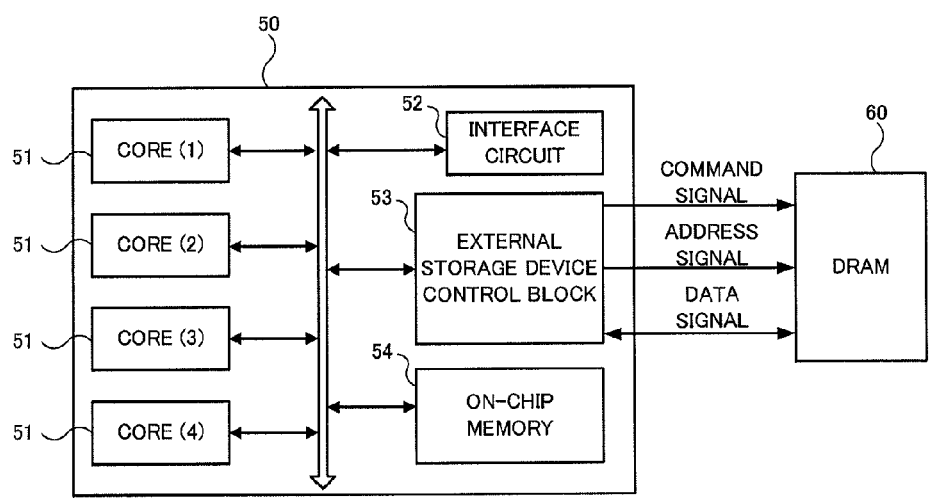
FIG. 25 is a diagram showing a configuration example of a computer system comprising the DRAM of the embodiments.

Next, a computer system comprising the DRAM of the embodiments will be described with reference to FIG. 25. FIG. 25 is a block diagram showing a configuration example of the computer system comprising a DRAM 60 of the embodiments. In the computer system shown in FIG. 25, a multi-core processor including four processor cores 51 represented as core(1) to core(4), an interface circuit 52, an external storage device control block 53 and an on-chip memory 54 is implemented on a single chip, and the DRAM 60 of the embodiments is separately implemented on another chip. In the multi-core processor 50 of FIG. 25, access to the DRAM 60 is controlled by the external storage device control block 53. The external storage device control block 53 sends a command signal and an address signal to the DRAM 60, and the DRAM 60 transfers a data signal from/to the external storage device control block 53. In this manner, the DRAM 60 in the configuration example of FIG. 25 functions as an external storage device. By applying the configuration of the embodiments to the DRAM 60, it is possible to prevent a decrease in access efficiency in the auto-refresh operation even when a large number of pages are used in the open state in a multi-bank configuration, thereby obtaining a large effect of the invention.

In the foregoing, the preferred embodiments of the present invention have been described. However the present invention is not limited to the above embodiments and can variously be modified without departing the essentials of the present invention, and the present invention obviously covers the various modifications. That is, the present invention covers the various modifications which those skilled in the art can carry out in accordance with all disclosures including claims and technical ideas. For example, in the above embodiments, the configuration of the DRAM as the semiconductor device has been described. However, the present invention is not limited to the DRAM, and can be applied to various semiconductor devices each having a memory unit, such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

The invention claimed is:

1. A semiconductor device comprising:
a memory cell array configured to comprise a plurality of memory cells each respectively arranged at an intersection of one of a plurality of word lines and one of a plurality of bit lines;
a register circuit configured to store state information related to at least one of the plurality of word lines;
an first comparison circuit configured to determine if a relief originating address matches a refresh address;
a first selector configured to select a first address between an array address and a relief destination array address in response to the determination of the first comparison circuit;
a second comparison circuit configured to determine if the first address, selected by the first selector, is related to the at least one of the plurality of word lines;
a second selector configured to select a second address between the relief destination address and the array address in response to the determination of the second comparison circuit; and a control circuit configured to perform a refresh operation on a memory cell, wherein the refresh operation determines an address of the memory cell by at least the second address.

2. The semiconductor device of claim 1, wherein a refresh address circuit is configured to generate the refresh address in response to a refresh command.

3. The semiconductor device of claim 2, wherein the refresh address circuit is further configured to generate the array address in response to the refresh command.

4. The semiconductor device of claim 1, wherein the array address identifies the at least one of the plurality of word lines and the relief originating address is a row address at which the at least one word line has been relieved by a redundancy word line.

5. The semiconductor device of claim 1, wherein the memory cell array control circuit is further configured to perform a second refresh operation on a second memory cell, which is coupled in common to a second word line, without changing the state of the at least one word line.

6. The semiconductor device of claim 1, further comprising a plurality of memory cell arrays each including a plurality of word lines, a plurality of bit lines, and a plurality of memory cells, wherein each of the plurality of memory cells being respectively arranged at a corresponding one of the intersections of the word and bit lines.

7. The semiconductor device of claim 5, wherein the at least one word line is included in another memory cell array.

8. The semiconductor device of claim 1, wherein the control circuit does not select the at least one word line by the refresh address when the first comparison circuit determines that the relief originating address matches the refresh address.

9. The semiconductor device of claim 1, wherein the register circuit is further configured to store a plurality of state information each related to at least one of the plurality of word lines.

10. A refresh control method of a semiconductor device having a plurality of memory cells each respectively arranged at an intersection of one of a plurality of word lines and one of a plurality of bit lines, the method comprising:
determining if a relief originating address matches a refresh address;
generating a first match signal in response to determining whether the relief originating address matches the refresh address;
selecting a first address between an array address and a relief destination array address in response to the first match signal;
determining if the first address is addressed to at least one of the plurality of word lines;
generating a second match signal in response to the determination whether the first address is matched to the at least one of the plurality of word lines;
selecting a second address between the relief destination address and the array address in response to the second match signal; and
performing a refresh operation on at least one of the memory cells in response to at least the second address.

11. The refresh control method according to claim 10, further comprising setting the first match signal active in response to determining whether the relief originating address matches the refresh address and setting the first address to the relief destination array address in response to activating the first match signal.

12. The refresh control method according to claim 10, further comprising setting the second match signal active when the relief destination array address matches an address of one of the plurality of word lines and setting the second address to the relief destination address.

13. The refresh control method according to claim 10, further comprising setting the first match signal inactive when the relief originating address does not match the refresh address and setting the first address to the refresh address in response to activating the first match signal.

14. The refresh control method according to claim 10, further comprising setting the second match signal active when the refresh address matches an address of one of the plurality of word lines and setting the second address to the refresh address in response to activating the first match signal.

15. The refresh control method according to claim 10, further comprising generating the refresh address in response to a refresh command.

16. The refresh control method according to claim 10, further comprising generating the array address in response to receiving the refresh command.

17. The refresh control method according to claim 10, further comprising identifying that the relief originating address is a row address at which the at least one word line has been relieved by a redundancy word line.

18. The refresh control method according to claim 10, further comprising performing a second refresh operating on a second memory cell, which is coupled in common to a second word line, without changing the state of the at least one word line.

19. The refresh control method according to claim 10, further comprising in response to determining that the relief originating address matches the refresh address, inhibiting selection of the at least one word line by using the refresh address.

20. The refresh control method according to claim 10, further comprising storing a plurality of state information each related to at least one of the plurality of word lines.

21. The refresh control method according to claim 10, wherein the refresh operation further comprises changing a first logic level of one of the word lines related to the at least one memory cell to a second logic level;
refreshing the at least one memory cell; and
changing the logic level of the one of the word lines from the second logic level to the first logic level after said refreshing.

* * * * *